United States Patent
Nakayama et al.

(10) Patent No.: US 10,199,476 B2
(45) Date of Patent: Feb. 5, 2019

(54) SEMICONDUCTOR DEVICE AND MANUFACTURING METHOD OF SEMICONDUCTOR DEVICE

(71) Applicant: Renesas Electronics Corporation, Tokyo (JP)

(72) Inventors: Tatsuo Nakayama, Ibaraki (JP); Hironobu Miyamoto, Ibaraki (JP); Yasuhiro Okamoto, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/841,676

(22) Filed: Dec. 14, 2017

(65) Prior Publication Data
US 2018/0219089 A1   Aug. 2, 2018

(30) Foreign Application Priority Data
Jan. 27, 2017  (JP) ................. 2017-012688

(51) Int. Cl.
*H01L 29/66* (2006.01)
*H01L 29/778* (2006.01)
(Continued)

(52) U.S. Cl.
CPC .... *H01L 29/66431* (2013.01); *H01L 29/1066* (2013.01); *H01L 29/205* (2013.01); *H01L 29/42376* (2013.01); *H01L 29/66462* (2013.01); *H01L 29/7783* (2013.01); *H01L 29/7786* (2013.01); *H01L 29/7787* (2013.01);
(Continued)

(58) Field of Classification Search
CPC ............... H01L 29/2003; H01L 29/205; H01L 29/42376; H01L 29/66431; H01L 29/66462; H01L 29/7325; H01L 29/778; H01L 29/7781; H01L 29/7782; H01L 29/7783; H01L 29/7786; H01L 29/7787; H01L 29/7789; H01L 21/823431; H01L 21/823821; H01L 21/845
See application file for complete search history.

(56) References Cited

U.S. PATENT DOCUMENTS

2011/0031532 A1* 2/2011 Kikkawa ........... H01L 29/66462
                                                              257/194
2017/0288046 A1* 10/2017 Miyamoto .......... H01L 21/0254

FOREIGN PATENT DOCUMENTS

JP          5684574 B2      3/2015
WO     2010/064706 A1      6/2010

* cited by examiner

*Primary Examiner* — Eduardo A Rodela
(74) *Attorney, Agent, or Firm* — Sughrue Mion, PLLC

(57) ABSTRACT

A mesa portion of a semiconductor device, which includes a channel base layer formed of a first nitride semiconductor layer, a channel layer formed of a second nitride semiconductor layer, a barrier layer formed of a third nitride semiconductor layer, a mesa-type fourth nitride semiconductor layer, a gate insulating film that covers the mesa portion, and a gate electrode formed over the gate insulating film, is used as a co-doped layer. The mesa portion is used as the co-doped layer, so that interface charges generated at an interface between the gate insulating film and the mesa portion can be cancelled by p-type impurity or n-type impurity in the co-doped layer and a threshold potential can be improved. Further, the fourth nitride semiconductor layer is n-type until the gate insulating film is formed, and the fourth nitride semiconductor layer is made neutral or p-type after the gate insulating film is formed.

9 Claims, 41 Drawing Sheets

(51) Int. Cl.
*H01L 29/205* (2006.01)
*H01L 29/423* (2006.01)
*H01L 29/10* (2006.01)
H01L 29/20 (2006.01)
H01L 29/40 (2006.01)
H01L 29/207 (2006.01)

(52) U.S. Cl.
CPC ...... *H01L 29/7789* (2013.01); *H01L 29/2003* (2013.01); *H01L 29/207* (2013.01); *H01L 29/402* (2013.01)

SEMICONDUCTOR DEVICE AND MANUFACTURING METHOD OF SEMICONDUCTOR DEVICE

CROSS-REFERENCE TO RELATED APPLICATIONS

The disclosure of Japanese Patent Application No. 2017-012688 filed on Jan. 27, 2017 including the specification, drawings and abstract is incorporated herein by reference in its entirety.

BACKGROUND

The present invention relates to a semiconductor device and a manufacturing method of a semiconductor device, and in particular, the present invention can be preferably used for a semiconductor device using a nitride semiconductor and a manufacturing method of the semiconductor device.

A GaN-based nitride semiconductor has wide band gap and high electron mobility as compared with Si and GaAs. Therefore, the GaN-based nitride semiconductor is expected to be applied to transistors for high breakdown voltage application, high output application, and high frequency application. Therefore, the GaN-based nitride semiconductors have been actively developed in recent years. Among such transistors, a transistor with normally-off characteristics is useful, so that a structure having normally-off characteristics is being studied.

For example, Japanese Patent No. 5684574 discloses a semiconductor device including a base layer, an electron supply layer, a two-dimensional electron gas eliminating layer, agate insulating film, and a gate electrode. All of the base layer, the electron supply layer, and the two-dimensional electron gas eliminating layer are a wurtzite type Group III nitride semiconductor layer whose main surface is inclined within 10° in an arbitrary direction from (0001) plane.

SUMMARY

The inventors are engaged in research and development of semiconductor devices using a nitride semiconductor, earnestly study about improvement of characteristics of the semiconductor device, and in particular, discuss about a structure (mesa-type MOS structure) of a transistor having normally-off characteristics. In the process of the study, the inventors have found a problem that undesired positive charges are induced at an interface between a mesa-type layer (the two-dimensional electron gas eliminating layer described above) and a gate insulating film and a desired threshold potential cannot be obtained.

As described above, there is room for improvement in the semiconductor device using a nitride semiconductor, and study of a configuration of a semiconductor device for improving characteristics thereof and a manufacturing method of the semiconductor device is desired.

Other objects and novel features will become apparent from the description of the present specification and the accompanying drawings.

The following briefly explains the outline of typical embodiments among the embodiments disclosed in the present application.

In a semiconductor device shown in an embodiment disclosed in the present application, a channel base layer formed of a first nitride semiconductor layer, a channel layer formed of a second nitride semiconductor layer, and a barrier layer formed of a third nitride semiconductor layer are sequentially laminated. Over the laminated body, the semiconductor device has a mesa portion formed of a mesa-type fourth nitride semiconductor layer. The fourth nitride semiconductor layer has n-type impurity and p-type impurity, and concentration of the p-type impurity is higher than concentration of the n-type impurity.

A manufacturing method of a semiconductor device shown in an embodiment disclosed in the present application includes a step of processing a fourth nitride semiconductor layer containing p-type impurity and n-type impurity into mesa type and a step of forming a gate insulating film over the mesa-type fourth nitride semiconductor layer. The manufacturing method further includes a step of activating the p-type impurity in the fourth nitride semiconductor layer after the step of forming the gate insulating film.

A manufacturing method of a semiconductor device shown in an embodiment disclosed in the present application includes a step of forming an insulating film over a fourth nitride semiconductor layer containing p-type impurity and n-type impurity and a step of forming a conductive film over the insulating film. The manufacturing method also includes a step of forming a laminated body of the fourth nitride semiconductor layer, a gate insulating film, and a gate electrode by processing the fourth nitride semiconductor layer, the insulating film, and the conductive film. The manufacturing method further includes a step of activating the p-type impurity in the fourth nitride semiconductor layer after the step of forming an insulating film.

According to a semiconductor device shown in a typical embodiment described below, which is disclosed in the present application, it is possible to improve characteristics of the semiconductor device.

According to a manufacturing method of a semiconductor device shown in a typical embodiment described below, which is disclosed in the present application, it is possible to manufacture a semiconductor device having excellent characteristics.

DETAILED DESCRIPTION

Figure 1:
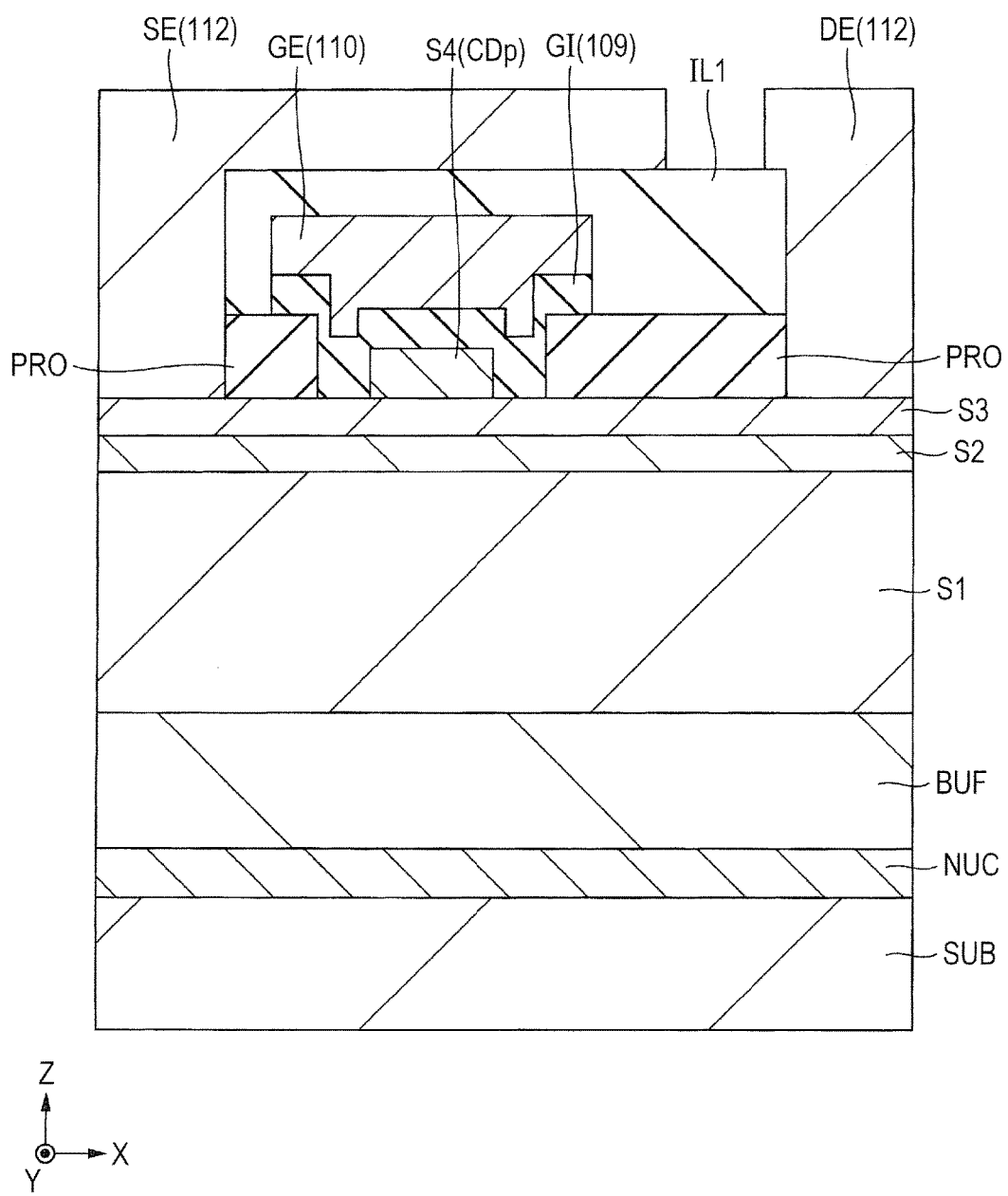
FIG. 1 is a cross-sectional view showing a configuration of a semiconductor device of a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, an application example, a detailed explanation, or a supplementary explanation thereof. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, an element (including an element step, etc.) is not necessarily indispensable, except for the case where it is clearly specified in particular and where it is considered to be clearly indispensable from a theoretical point of view, etc. Similarly, in the following embodiments, when shape, position relationship, etc. of an element etc. are referred to, what resembles or is similar to the shape, etc. substantially shall be included, except for the case where it is clearly specified in particular and where it is considered to be clearly not right from a theoretical point of view. This statement also applies to the number of elements, etc. (including the number, a numeric value, an amount, a range, etc.) described above.

Hereinafter, the embodiments will be described with reference to the drawings. In all the drawings for explaining the embodiments, the same or a related symbol is attached to members having the same function, and the repeated explanation thereof is omitted. When there is a plurality of similar members (regions), an individual or a specific region may be represented by adding a sign to a generic symbol. In the embodiments described below, in principle, the same or similar component will not be repeatedly described unless otherwise required.

In the drawings used in the embodiments, even if the drawing is a cross-sectional view, hatching may be omitted to make the drawing easy to see.

Further, in a cross-sectional view, the size of each region does not correspond to the size of a real device, and the size of a specific region may be shown relatively larger than it actually is to make the drawing easy to understand.

First Embodiment

Hereinafter, a semiconductor device of the present embodiment will be described in detail with reference to the drawings.
[Description of Structure]

FIG. 1 is a cross-sectional view showing a configuration of the semiconductor device of the present embodiment. The semiconductor device shown in FIG. 1 is a field effect transistor (FET) using a nitride semiconductor. The semiconductor device is also called a high electron mobility transistor (HEMT).

In the semiconductor device of the present embodiment, a nucleation layer NUC and a high-resistance buffer layer BUF are provided over a substrate SUB.

As the substrate SUB, for example, it is possible to use a semiconductor substrate formed of silicon (Si) whose (111) surface is exposed. As the substrate SUB, it is possible to use a substrate formed of SiC, sapphire, or the like in addition to silicon. Further, it is possible to use a substrate formed of GaN, and in this case, the nucleation layer may be omitted.

The nucleation layer NUC is formed of a nitride semiconductor layer. As the nucleation layer NUC, for example, an aluminum nitride (AlN) layer may be used. The high-resistance buffer layer BUF is formed of one layer or a plurality of layers of a nitride semiconductor layer where impurities forming a deep level are added to a nitride semiconductor. As the high-resistance buffer layer BUF, for example, it is possible to use a superlattice structure where a laminated film (AlN/GaN film) of a gallium nitride (GaN) layer and an aluminum nitride (AlN) layer is repeatedly laminated as a superlattice structure (also referred to as a superlattice layer) formed of a plurality of nitride semiconductor layers.

Normally, all nitride semiconductor layers (group III-V compound semiconductor layers) over the substrate SUB are formed by group III element surface growth.

A first nitride semiconductor layer S1, a second nitride semiconductor layer S2, and a third nitride semiconductor layer S3 are formed in order over the high-resistance buffer layer BUF. A fourth nitride semiconductor layer S4 is formed over a central portion of the third nitride semiconductor layer S3.

The electron affinity of the second nitride semiconductor layer S2 is greater than that of the first nitride semiconductor layer S1 and is greater than that of the third nitride semiconductor layer S3 (S2>S1 and S2>S3).

The fourth nitride semiconductor layer S4 is mesa type (mesa-shaped, protruding-shaped, or line-shaped). The electron affinity of the fourth nitride semiconductor layer S4 is the same as that of the first nitride semiconductor layer S1 or is greater than that of the first nitride semiconductor layer S1 (S4≥S1).

The first nitride semiconductor layer S1 is also called a channel base layer and is formed of, for example, AlGaN. The second nitride semiconductor layer S2 is also called a channel layer and is formed of, for example, GaN. The third nitride semiconductor layer S3 is also called a barrier layer (electron supply layer) and is formed of, for example, AlGaN. However, Al composition of the third nitride semiconductor layer S3 is greater than that of the first nitride semiconductor layer S1. The mesa-type fourth nitride semiconductor layer S4 is also called a mesa portion and is formed of, for example, GaN.

Agate insulating film GI is formed over the mesa-type fourth nitride semiconductor layer (mesa portion) S4. The gate insulating film GI is formed so as to cover the mesa-type fourth nitride semiconductor layer (mesa portion) S4. In other words, the width (the length in the gate length) of the gate insulating film GI is greater than the width of the mesa-type fourth nitride semiconductor layer (mesa portion) S4. Therefore, the mesa-type fourth nitride semiconductor layer (mesa portion) S4 and a gate electrode GE are separated from each other by the gate insulating film GI. The gate insulating film GI is formed over both side surfaces and the upper surface of the mesa-type fourth nitride semiconductor layer (mesa portion) S4. Unevenness is generated on the surface of the gate insulating film GI corresponding to the shape of the mesa-type fourth nitride semiconductor layer (mesa portion) S4. The gate electrode GE is formed over the gate insulating film GI.

A surface protection film (a protective insulating film or an insulating film) PRO is formed over the third nitride semiconductor layer (barrier layer) S3 and over both sides of the mesa-type fourth nitride semiconductor layer (mesa portion) S4. A laminated body of the gate insulating film GI and the gate electrode GE is formed so as to cover the mesa-type fourth nitride semiconductor layer (mesa portion) S4 and is further formed so as to overlap with the surface protection film PRO.

An interlayer insulating film IL1 is formed over the gate electrode GE and the surface protection film PRO.

A source electrode SE and a drain electrode DE are formed over the third nitride semiconductor layer (barrier layer) S3 and over both sides of the mesa-type fourth nitride semiconductor layer (mesa portion) S4. For example, a contact hole is formed in a laminated film of the surface protection film PRO and the interlayer insulating film IL1, and the source electrode SE and the drain electrode DE are arranged in and over the contract hole.

Figure 2:
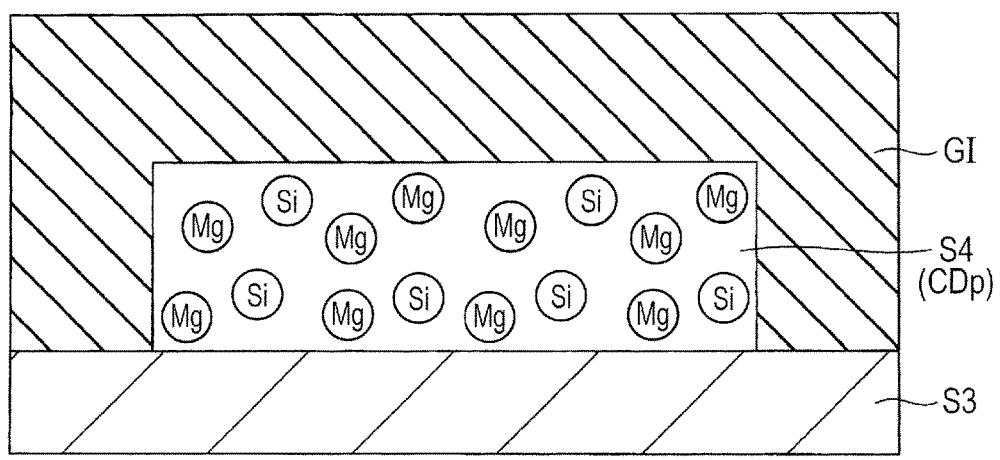
FIG. 2 is a cross-sectional view schematically showing a configuration of a fourth nitride semiconductor layer (mesa portion).
Figure 3A:
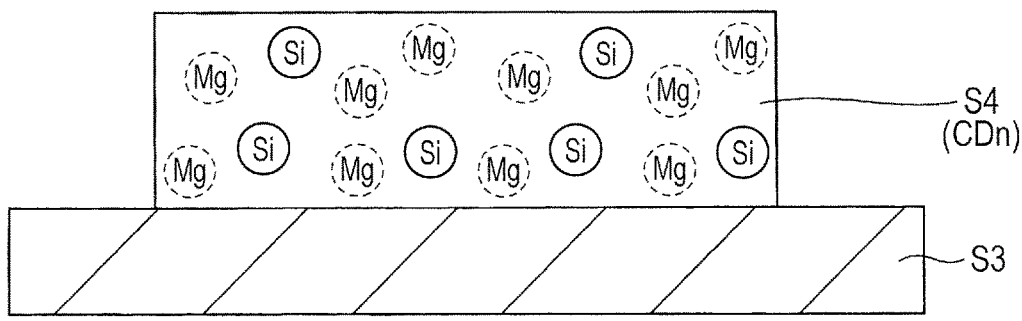
FIGS. 3A, 3B and 3C are cross-sectional views schematically showing steps from a mesa-type fourth nitride semiconductor layer (mesa portion) forming step to an impurity activation step.
Figure 3B:
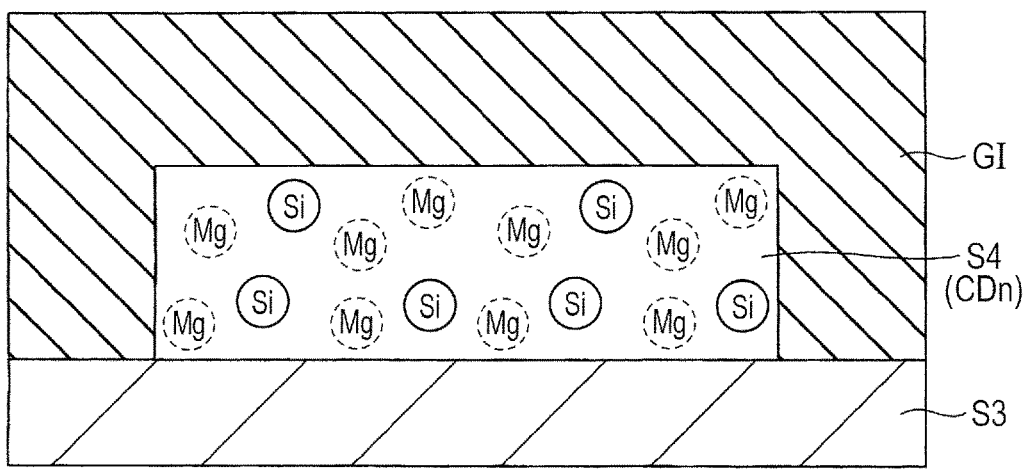
Figure 3C:
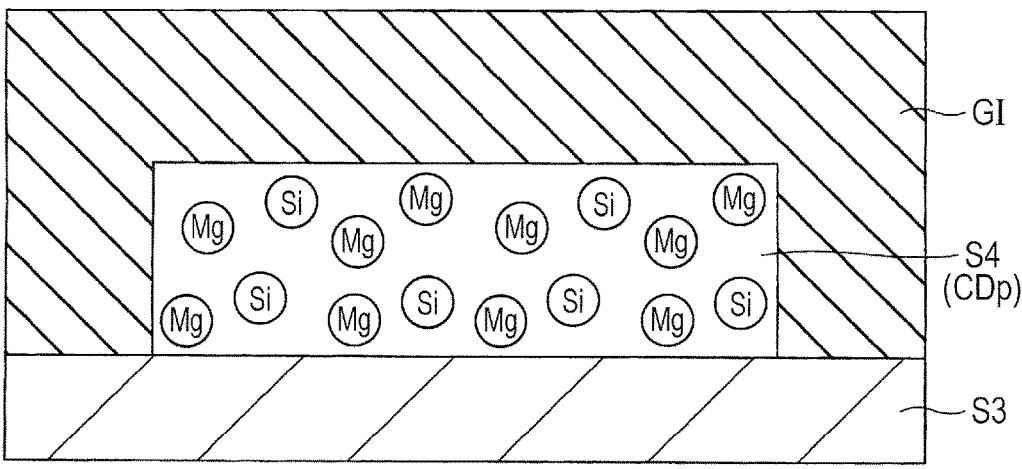

Here, in the present embodiment, the mesa-type fourth nitride semiconductor layer (mesa portion) S4 is a co-doped layer. The co-doped layer is formed of a nitride semiconductor layer which contains p-type impurities and n-type impurities in a nitride semiconductor. The co-doped layer is, for example, a GaN layer containing Mg which is a p-type impurity and Si which is an n-type impurity. FIG. 2 is a cross-sectional view schematically showing a configuration of the mesa-type fourth nitride semiconductor layer (mesa portion) S4 in FIG. 1. FIGS. 3A, 3B and 3C are cross-sectional views schematically showing steps from a mesa-type fourth nitride semiconductor layer (mesa portion) S4 forming step to an impurity activation step.

As shown in FIG. 2, a co-doped layer CDp which is the mesa-type fourth nitride semiconductor layer (mesa portion) S4 contains Mg, which is a p-type impurity, more than Si, which is an n-type impurity. In other words, the concentration of p-type impurity (here, Mg) in the co-doped layer CDp is higher than (greater than) the concentration of n-type impurity (here, Si). In further other words, the contained amount (the addition amount) of p-type impurity (here, Mg) in the co-doped layer CDp is greater than the contained amount of n-type impurity (here, Si) (Mg rich). The concentration and the contained amount of impurity can be represented by, for example, the number of impurity elements per unit volume.

In the co-doped layer CDp which is the mesa-type fourth nitride semiconductor layer (mesa portion) S4, both the n-type impurity (here, Si) and the p-type impurity (here, Mg)

are activated. Therefore, carriers (electrons) due to the n-type impurity in the co-doped layer CD are compensated by carriers (holes) due to the p-type impurity, and the co-doped layer is a p-type semiconductor region (CDp).

However, at the beginning of the formation of the co-doped layer, which is the fourth nitride semiconductor layer (mesa portion) S4, the p-type impurity (here, Mg) is not activated and the co-doped layer is an n-type semiconductor region (CDn). In other words, the n-type impurity (here, Si) is present in the co-doped layer in an activated state from the beginning of the formation. On the other hand, the p-type impurity (here, Mg) is present in the co-doped layer in an inactivated state in the beginning of the formation. Therefore, at the beginning of the formation of the co-doped layer, which is the fourth nitride semiconductor layer (mesa portion) S4, the co-doped layer is the n-type semiconductor region (CDn).

In this way, the concentrations of the p-type impurity (here, Mg) and the n-type impurity (here, Si) in the co-doped layer CDp do not change before and after the activation, and the activation rate of the p-type impurity (here, Mg) changes. In FIGS. 2 and 3, activated impurities (Mg and Si) are surrounded by a solid line circle, and impurities (Mg) in a deactivated state are surrounded by a dashed line circle.

Next, a forming method of a co-doped layer will be described with reference to FIGS. 3A, 3B and 3C. For example, as shown in FIG. 3A, the mesa-type fourth nitride semiconductor layer (mesa portion) S4 is formed. First, the fourth nitride semiconductor layer S4 containing the p-type impurity (here, Mg) and the n-type impurity (here, Si) is formed over the third nitride semiconductor layer. The fourth nitride semiconductor layer S4 contains Mg, which is a p-type impurity, more than Si, which is an n-type impurity. While the n-type impurity (here, Si) is in an activated state from the beginning of the film formation, the p-type impurity (here, Mg) is not activated and the co-doped layer is the n-type semiconductor region (CDn). Next, the fourth nitride semiconductor layer S4 is processed into a mesa type.

Next, as shown in FIG. 3B, the gate insulating film GI is formed over the mesa-type fourth nitride semiconductor layer S4. In this case, the gate insulating film GI is formed over the n-type fourth nitride semiconductor layer S4.

Next, as shown in FIG. 3C, the p-type impurity (here, Mg) in the fourth nitride semiconductor layer S4 is activated. For example, the p-type impurity (here, Mg) is activated by applying heat treatment (annealing). By such heat treatment, hydrogen (H) in the fourth nitride semiconductor layer S4 is removed, and the p-type impurity (here, Mg) is activated. Here, the co-doped layer, which is the mesa-type fourth nitride semiconductor layer (mesa portion) S4, contains Mg, which is a p-type impurity, more than Si, which is an n-type impurity, so that the co-doped layer is the p-type semiconductor region (CDp).

Figure 4A:
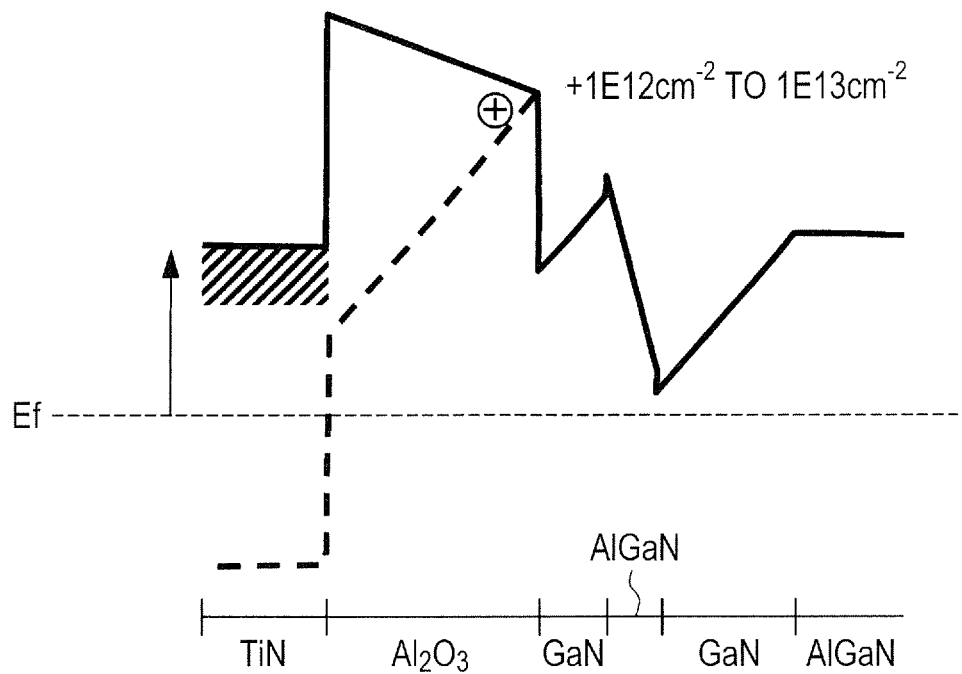
FIGS. 4A and 4B are band diagrams near a laminated portion of a mesa-type fourth nitride semiconductor layer (mesa portion) and a gate insulating film lamination portion.
Figure 4B:
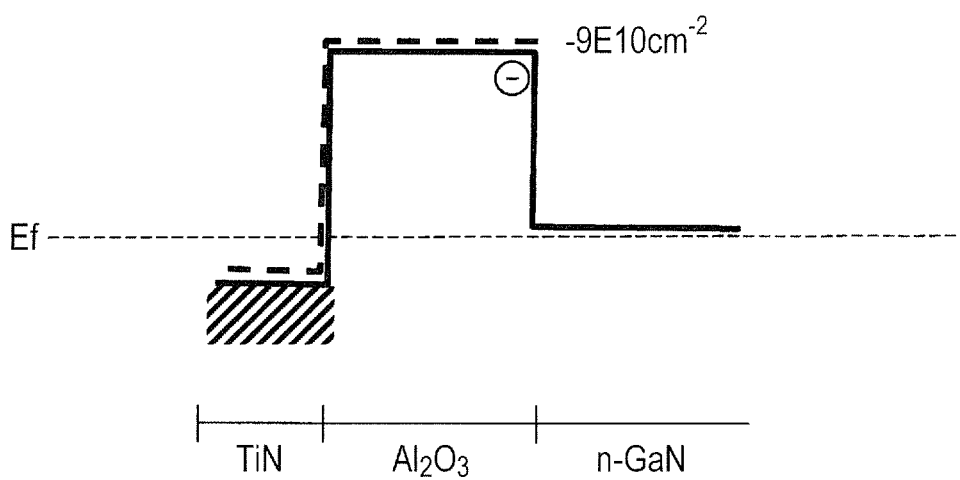

FIGS. 4A and 4B are band diagrams near a laminated portion of the mesa-type fourth nitride semiconductor layer (mesa portion) and the gate insulating film lamination portion.

FIG. 4A is a band diagram in a case in which TiN/Al$_2$O$_3$/GaN/AlGaN/GaN/ and AlGaN are laminated as a gate electrode/a gate insulating film/a mesa portion/a barrier layer/a channel layer/and a channel base layer. GaN is non-doped. In this case, positive charge of about 1E12 to 1E13 cm$^{-2}$ are induced between the gate insulating film (Al$_2$O$_3$) and the mesa portion (GaN). Therefore, it is found out that a threshold potential is lower than a design value in such a laminated structure.

On the other hand, as shown in FIG. 4B, in a laminated body of TiN/Al$_2$O$_3$/ and n-GaN, positive charge is not induced and it is found out that negative charges of about 9E10 cm$^{-2}$ are induced.

It is considered that the lowering of the threshold potential is due to interface charges generated when the gate insulating film is formed. Therefore, in the present embodiment, the fourth nitride semiconductor layer S4 is the co-doped layer, so that interface charges generated at an interface between the gate insulating film and the mesa portion can be cancelled by the p-type impurity (here, Mg) or the n-type impurity (here, Si) in the co-doped layer. Thereby, the threshold potential can be improved. In other words, it is possible to improve normally-off characteristics.

Further, as described referring to FIGS. 3A, 3B and 3C, the fourth nitride semiconductor layer S4 is n-type until a forming step of the gate insulating film, so that the same state as that of FIG. 4B is obtained and it is possible to suppress induction of positive charge that can be generated at the interface between the gate insulating film and the mesa portion. Although the positive charge at the interface between the gate insulating film and the mesa portion lowers the threshold potential, the negative charge at the interface between the gate insulating film and the mesa portion improves the threshold potential. Further, the fourth nitride semiconductor layer S4 is made p-type after the forming step of the gate insulating film, so that it is possible to further improve the threshold potential. The fourth nitride semiconductor layer S4 after the forming step of the gate insulating film may be neutral (a state of being neither n-type nor p-type).

In this way, in the present embodiment, the mesa-type fourth nitride semiconductor layer (mesa portion) is the co-doped layer, so that it is possible to improve the threshold potential and improve the normally-off characteristics. Further, the fourth nitride semiconductor layer S4 is n-type until the gate insulating film is formed over the fourth nitride semiconductor layer S4, and the fourth nitride semiconductor layer S4 is made neutral or p-type after the gate insulating film is formed. Thereby, it is possible to improve the threshold potential and improve the normally-off characteristics.

The polarity (p-type or n-type) of semiconductor region can be determined by, for example, a scanning capacitance microscope (SCM). A co-doped layer of high electron concentration corresponds to the n-type semiconductor region CDn, and a co-doped layer of high hole concentration corresponds to the p-type semiconductor region CDp. A carrier concentration (the electron concentration or the hole concentration) can be measured by, for example, a scanning microwave microscope (SMM).

(About Concentration of P-Type Impurity)

As described above, the concentration of the p-type impurity in the co-doped layer, which is the mesa-type fourth nitride semiconductor layer (mesa portion) S4, is required to be higher than the concentration of the n-type impurity (the concentration of the n-type impurity<the concentration of the p-type impurity). It is preferable to adjust introduction amounts of the p-type impurity (here, Mg) and the n-type impurity (here, Si) into the co-doped layer CD by considering the activation rates of the p-type impurity (here, Mg) and the n-type impurity (here, Si). For example, by considering the activation rates, the concentration of the p-type impurity (here, Mg) to be introduced into the co-doped layer CD is preferable to be five times or more the concentration of the n-type impurity (here, Si) and is more preferable to be ten times or more the concentration of the n-type impurity (here, Si).

As described above, the positive charge induced at the interface between the gate insulating film and the non-doped nitride semiconductor layer ($Al_2O_3$/GaN) is greater than or equal to 1E12 $cm^{-2}$, so that it is preferable that a product of the concentration of the p-type impurity (here, Mg) in the mesa-type fourth nitride semiconductor layer (mesa portion) S4 and the film thickness of the mesa-type fourth nitride semiconductor layer (mesa portion) S4 is greater than or equal to 1E12 $cm^{-2}$.

On the other hand, an upper limit of the concentration of the p-type impurity (here, Mg) is preferable to be lower than or equal to a concentration where a neutral region is formed in a valence band because when a neutral region is formed in the valence band, modulation by gate becomes difficult. While the concentration where a neutral region is formed in the valence band varies depending on the film type and the film thickness of the mesa-type fourth nitride semiconductor layer (mesa portion) S4, for example, when a GaN layer of 20 nm is used, for the p-type impurity (here, Mg), the concentration where a neutral region is formed in the valence band is about 1E19 $cm^{-2}$. Therefore, in this case, it is preferable that the p-type impurity (here, Mg) is lower than 1E19 $cm^{-2}$.

The p-type impurity (here, Mg) is deactivated due to effects of hydrogen (hydrogen atoms). Therefore, it is preferable that the concentration of the p-type impurity (here, Mg) in the mesa-type fourth nitride semiconductor layer (mesa portion) S4 is greater than the sum of the concentration of the n-type impurity (here, Si) and the concentration of hydrogen atoms.

From the viewpoint of stability of the impurity concentration, it is preferable that the concentration of the p-type impurity (here, Mg) is within a range of $5 \times 10^{17}$ $cm^{-3}$ to $2 \times 10^{19}$ $cm^{-3}$. On the other hand, it is preferable that the concentration of the n-type impurity (here, Si) is within a range of $5 \times 10^{16}$ $cm^{-3}$ to $2 \times 10^{18}$ $cm^{-3}$. When the concentrations are within such ranges, it is possible to accurately epitaxially grow a nitride semiconductor layer (for example, GaN layer) while introducing the p-type impurity (here, Mg) and the n-type impurity (here, Si) into the co-doped layer CD.

[Description of Manufacturing Method]

Next, the manufacturing method of the semiconductor device of the present embodiment will be described and the configuration of the semiconductor device will be more clarified with reference to FIGS. 5 to 23. FIGS. 5 to 23 are cross-sectional views showing manufacturing steps of the semiconductor device of the present embodiment.

Figure 5:
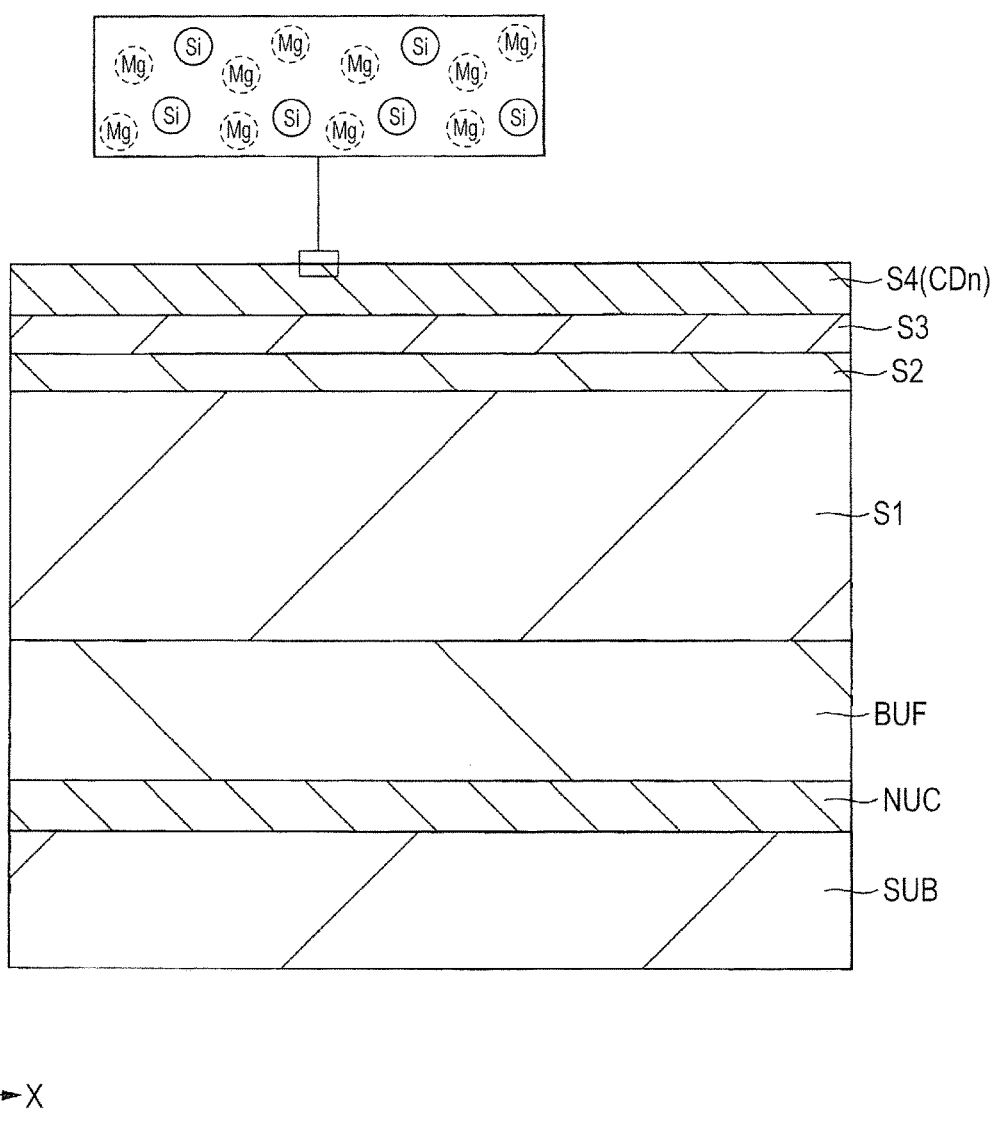
FIG. 5 is a cross-sectional view showing a manufacturing step of the semiconductor device of the first embodiment.

As shown in FIG. 5, the nucleation layer NUC is formed over the substrate SUB and thereafter the high-resistance buffer layer BUF is formed over the nucleation layer NUC. As the substrate SUB, for example, a semiconductor substrate formed of silicon (Si) whose (111) surface is exposed is used. Over the substrate SUB, as the nucleation layer NUC, for example, an aluminum nitride (AlN) layer is epitaxially grown by about 200 nm by using a metal organic chemical vapor deposition (MOCVD) method or the like.

As the substrate SUB, it is possible to use a substrate formed of SiC, sapphire, or the like in addition to silicon. Further, it is possible to use a substrate formed of GaN, and in this case, the nucleation layer may be omitted. Normally, the nucleation layer and all the nitride semiconductor layers (group III-V compound semiconductor layers) over the nucleation layer are formed by group III element surface growth (that is, in this case, gallium surface growth or aluminum surface growth).

Next, over the nucleation layer NUC, as the high-resistance buffer layer BUF, a superlattice structure where a laminated film (AlN/GaN film) of a gallium nitride (GaN) layer and an aluminum nitride (AlN) layer is repeatedly laminated is formed. For example, a gallium nitride (GaN) layer with a film thickness of about 20 nm and an aluminum nitride (AlN) layer with a film thickness of about 5 nm are alternatively epitaxially grown by using the metal organic chemical vapor deposition method or the like. For example, 40 layers of the laminated films described above are formed. Over the superlattice structure, as a part of the high-resistance buffer layer BUF, for example, an AlGaN layer is epitaxially grown by using the metal organic chemical vapor deposition method or the like. The film thickness of the AlGaN layer is, for example, about 1 μm.

It is possible to appropriately adjust constituent materials and the film thickness of the high-resistance buffer layer BUF. For example, a single layer film not including the superlattice structure may be used.

As the constituent materials of the high-resistance buffer layer BUF, it is possible to use GaN, AlN, and InN and a mixed crystal of these. For example, besides the laminated film (AlN/GaN film) described above, it is possible to use a superlattice structure where an AlGaN/GaN film is repeatedly laminated, and a combination in which the superlattice structure is combined with the AlGaN layer and an InAlN layer. It is possible to appropriately add impurities to a film of the high-resistance buffer layer BUF. As the impurities, it is possible to use a transition metal such as Fe, and C, Mg, Be, and the like can be used.

Next, over the high-resistance buffer layer BUF, as the first nitride semiconductor layer (channel base layer) S1, an AlGaN layer is epitaxially grown by about 1000 nm by using the metal organic chemical vapor deposition method or the like. The composition of Al is about 5%. No impurity is intentionally doped into the first nitride semiconductor layer (channel base layer) S1.

It is possible to appropriately adjust constituent materials and the film thickness of the first nitride semiconductor layer (channel base layer) S1. As the constituent materials, it is possible to use GaN, AlN, InN, and the like in addition to AlGaN. Further, it is also possible to use a mixed crystal of these constituent materials (an InGaN layer, an AlGaN layer, an InAlN layer, and the like). However, to enhance an electron confinement effect in the second nitride semiconductor layer (channel layer) S2, it is preferable to use a material whose electron affinity is smaller than that of the second nitride semiconductor layer (channel layer) S2. In the present embodiment, the first nitride semiconductor layer (channel base layer) S1 is non-doped. However, it is possible to appropriately add impurities according to usage. As the impurities, an n-type impurity and a p-type impurity can be added. Examples of the n-type impurity include Si, O, S, Se, and the like, and examples of the p-type impurity include Be, C, Mg, Zn, and the like.

Next, over the first nitride semiconductor layer S1, as the second nitride semiconductor layer (channel layer) S2, a GaN layer is epitaxially grown by about 50 nm by using the metal organic chemical vapor deposition method or the like. No impurity is intentionally doped into the second nitride semiconductor layer (channel layer) S2. It is possible to appropriately adjust constituent materials and the film thickness of the second nitride semiconductor layer (channel layer) S2. As the constituent materials, it is possible to use AlN, InN, and the like in addition to GaN. Further, it is also possible to use a mixed crystal of these constituent materials (an InGaN layer, an AlGaN layer, an InAlN layer, and the like). In the present embodiment, the second nitride semiconductor layer (channel layer) S2 is non-doped. However, it is possible to appropriately add impurities according to usage. As the impurities, an n-type impurity and a p-type impurity can be added. Examples of the n-type impurity include Si, O, S, Se, and the like, and examples of the p-type impurity include Be, C, Mg, Zn, and the like.

However, the second nitride semiconductor layer (channel layer) S2 is a layer in which electrons run, so that if an impurity doping amount is too large, there is a risk that the mobility of the electrons is lowered by Coulomb scattering. Therefore, the impurity doping amount to the second nitride semiconductor layer (channel layer) S2 is preferable to be smaller than or equal to $1\times10^{17}$ (1E17) $cm^{-3}$.

For the second nitride semiconductor layer (channel layer) S2, a nitride semiconductor is used whose electron affinity is greater than those of the first nitride semiconductor layer (channel base layer) S1 and the third nitride semiconductor layer (barrier layer) S3.

Next, over the second nitride semiconductor layer S2, as the third nitride semiconductor layer (barrier layer) S3, an AlGaN layer is epitaxially grown by about 20 nm by using the metal organic chemical vapor deposition method or the like. The composition of Al is about 20%. No impurity is intentionally doped into the third nitride semiconductor layer (barrier layer) S3. It is possible to appropriately adjust constituent materials and the film thickness of the third nitride semiconductor layer (barrier layer) S3. As the constituent materials, it is possible to use GaN, AlN, InN, and the like in addition to the AlGaN layer. Further, it is also possible to use a mixed crystal of these constituent materials (an InGaN layer, an AlGaN layer, an InAlN layer, and the like). However, to generate a two-dimensional electron gas (2DEG), it is preferable to use a material whose electron affinity is smaller than (whose band gap is greater than) that of the second nitride semiconductor layer (channel layer) S2. In the present embodiment, the third nitride semiconductor layer (barrier layer) S3 is non-doped. However, it is possible to appropriately add impurities according to usage. As the impurities, an n-type impurity and a p-type impurity can be added. Examples of the n-type impurity include Si, O, S, Se, and the like, and examples of the p-type impurity include Be, C, Mg, Zn, and the like.

Next, over the third nitride semiconductor layer S3, as the fourth nitride semiconductor layer (co-doped layer) S4, a GaN layer containing the p-type impurity (here, Mg) and the n-type impurity (here, Si) is epitaxially grown by about 20 nm by using the metal organic chemical vapor deposition method or the like. The fourth nitride semiconductor layer S4 contains Mg, which is a p-type impurity, more than Si, which is an n-type impurity. While the n-type impurity (here, Si) is in an activated state from the beginning of the film formation, the p-type impurity (Mg) is not activated and the fourth nitride semiconductor layer (co-doped layer) S4 is n-type.

For example, the co-doped layer is grown while introducing a carrier gas and a raw material gas into a device. As the raw material gas, a gas containing constituent elements of a nitride semiconductor layer (here, the GaN layer) is used. For example, when the GaN layer is formed, trimethylgallium (TMG) and ammonia are used as raw material gases of Ga and N, respectively. Bis(cyclopentadienyl) magnesium $(C_5H_5)_2Mg$ is used as a raw material gas of Mg which is a p-type impurity, and silane is used as a raw material gas of Si which is an n-type impurity. In this way, according to an epitaxial growth method, it is possible to easily and accurately adjust the doping amount (introduction amount) of the p-type impurity and the n-type impurity by adjusting flow rates of the raw material gases. Further, according to the epitaxial growth method, lattice defects due to implantation of atoms hardly occur as compared with an ion implantation method, so that it is possible to form a nitride semiconductor layer (here, GaN layer) with favorable characteristics.

For example, a GaN layer where the concentration (the doping amount) of Mg is $1\times10^{18}$ $cm^{-3}$ and the concentration (the doping amount) of Si is $2\times10^{17}$ $cm^{-3}$ is grown at a film thickness of about 20 nm. The types and concentrations of the impurities in the fourth nitride semiconductor layer (co-doped layer) S4 can be appropriately adjusted. Further, it is possible to appropriately adjust constituent materials and the film thickness of the fourth nitride semiconductor layer (co-doped layer) S4.

As the constituent materials, it is possible to use GaN, AlN, and InN. It is also possible to use a mixed crystal of these (for example, AlGaN). Regarding the impurity to be doped, as the n-type impurity, for example, O, S, Se, or the like can be used in addition to Si, and as the p-type impurity, for example, Zn, Be, C, or the like can be used in addition to Mg. Among them, it is preferable to use Si and Mg.

Regarding the impurities in the fourth nitride semiconductor layer (co-doped layer) S4, the concentration of the p-type impurity is required to be higher than the concentration of the n-type impurity. In particular, it is preferable to adjust the concentrations of the n-type impurity (here, Si) and the p-type impurity (here, Mg) by considering the activation rate of the p-type impurity (here, Mg) so that the fourth nitride semiconductor layer (co-doped layer) S4 after the activation does not become n-type. For example, by considering the activation rate, the concentration of the p-type impurity (here, Mg) to be introduced into the fourth nitride semiconductor layer (co-doped layer) S4 is preferable to be five times or more the concentration of the n-type impurity (here, Si) and is more preferable to be ten times or more the concentration of the n-type impurity (here, Si).

As described above, the positive charge induced at the interface between the non-doped nitride semiconductor layer and the gate insulating film GI is greater than or equal to 1E12 $cm^{-2}$, so that it is preferable that a product of the concentration of the p-type impurity (here, Mg) in the mesa-type fourth nitride semiconductor layer (mesa portion) S4 and the film thickness of the mesa-type fourth nitride semiconductor layer (mesa portion) S4 is greater than or equal to 1E12 $cm^{-2}$.

On the other hand, an upper limit of the concentration of the p-type impurity (here, Mg) is preferable to be lower than or equal to a concentration where a neutral region is formed in a valence band because when a neutral region is formed in the valence band, modulation by gate becomes difficult.

It is preferable that the concentration of the p-type impurity (here, Mg) is within a range of $5\times10^{17}$ $cm^{-3}$ to $2\times10^{19}$ $cm^{-3}$. On the other hand, it is preferable that the concentration of the n-type impurity (here, Si) is within a range of $5\times10^{16}$ $cm^{-3}$ to $2\times10^{18}$ $cm^{-3}$. When the concentrations are within such ranges, it is possible to accurately epitaxially grow a nitride semiconductor layer (for example, GaN layer) while introducing the p-type impurity (here, Mg) and the n-type impurity (here, Si) into the co-doped layer CD.

Also for the first to the third nitride semiconductor layers S1 to S3, the nitride semiconductor layer is grown while introducing a carrier gas and a raw material gas into a growth chamber. As the raw material gas, a gas containing constituent elements of the nitride semiconductor layer (here, the AlGaN layer or the GaN layer) is used. For example, when the AlGaN layer is formed, trimethylaluminum (TMAl), trimethylgallium (TMG), and ammonia are used as raw material gases of Al, Ga, and N, respectively. When the GaN layer is formed, trimethylgallium (TMG) and ammonia are used as raw material gases of Ga and N, respectively. In this way, according to an epitaxial growth method, it is possible to easily and accurately adjust a ratio of constituent elements of each layer by adjusting flow rates of the raw material gases. Further, according to the epitaxial growth method, it is possible to easily and continuously form layers of different constituent elements by switching the raw material gases.

Figure 6:
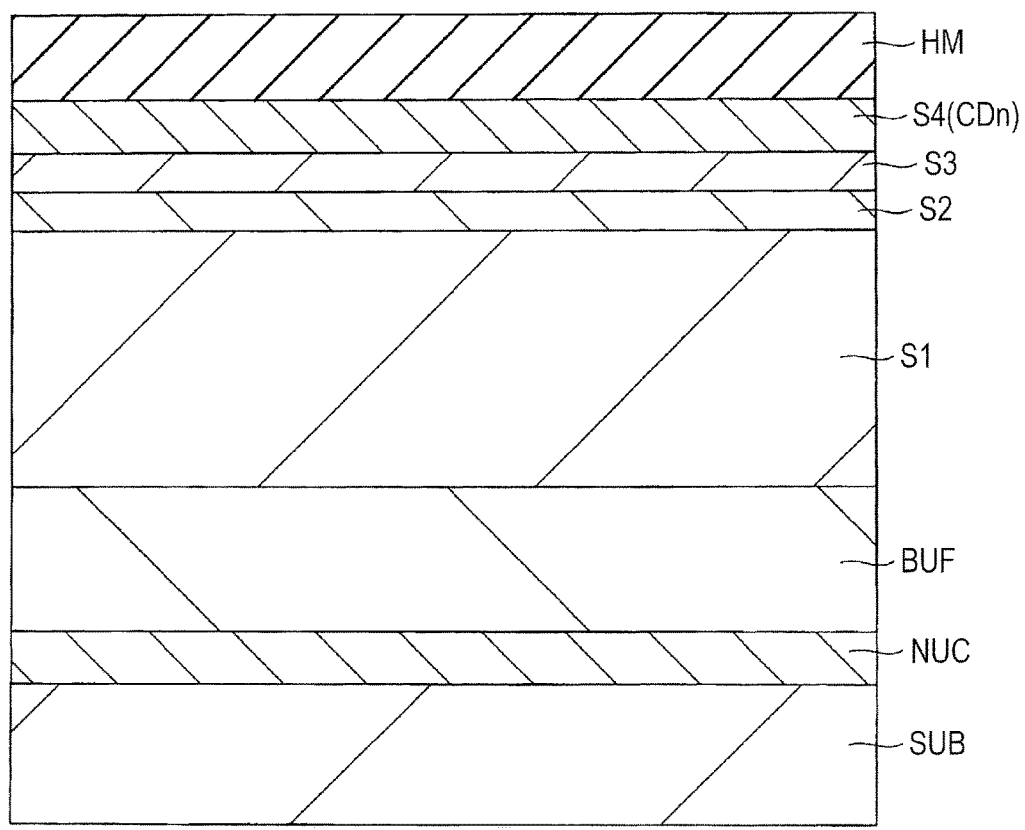
FIG. 6 is a cross-sectional view showing a manufacturing step of the semiconductor device of the first embodiment.

Next, as shown in FIG. 6, a silicon oxide film is deposited about 100 nm thick over the fourth nitride semiconductor layer S4 as a hard mask HM by using a CVD method or the like.

Figure 7:
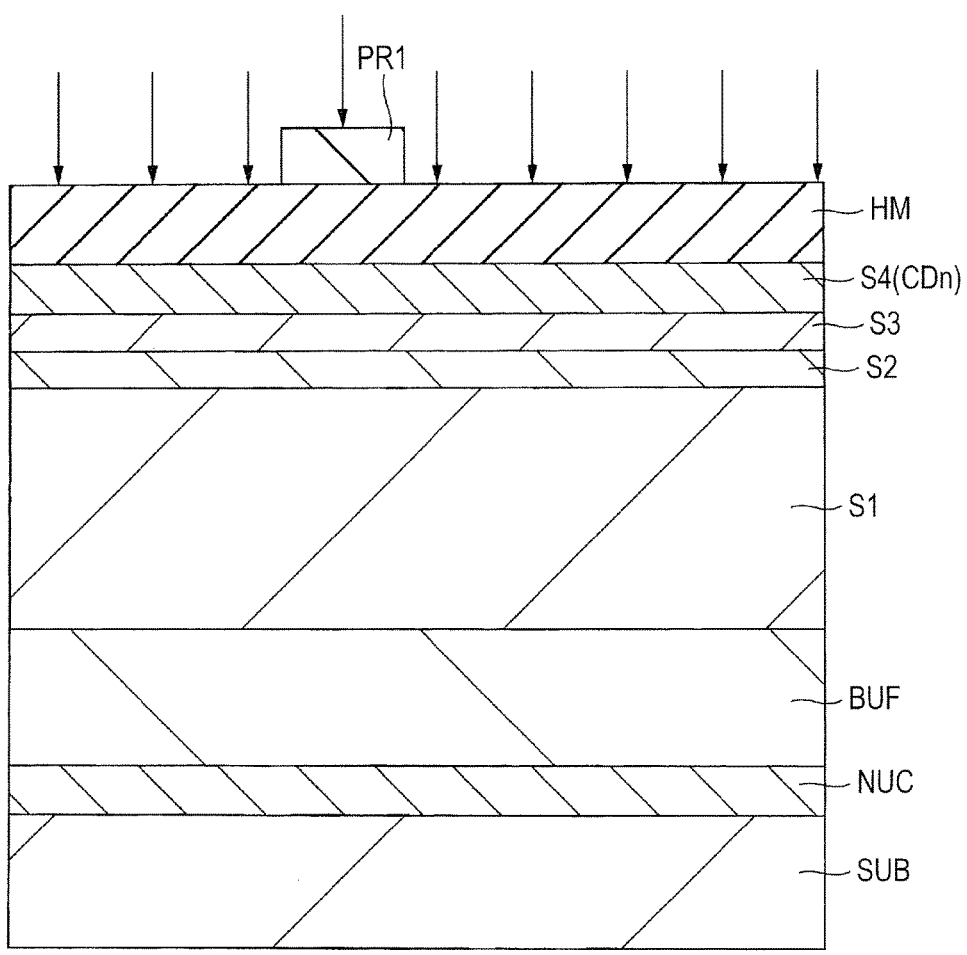
FIG. 7 is a cross-sectional view showing a manufacturing step of the semiconductor device of the first embodiment.
Figure 8:
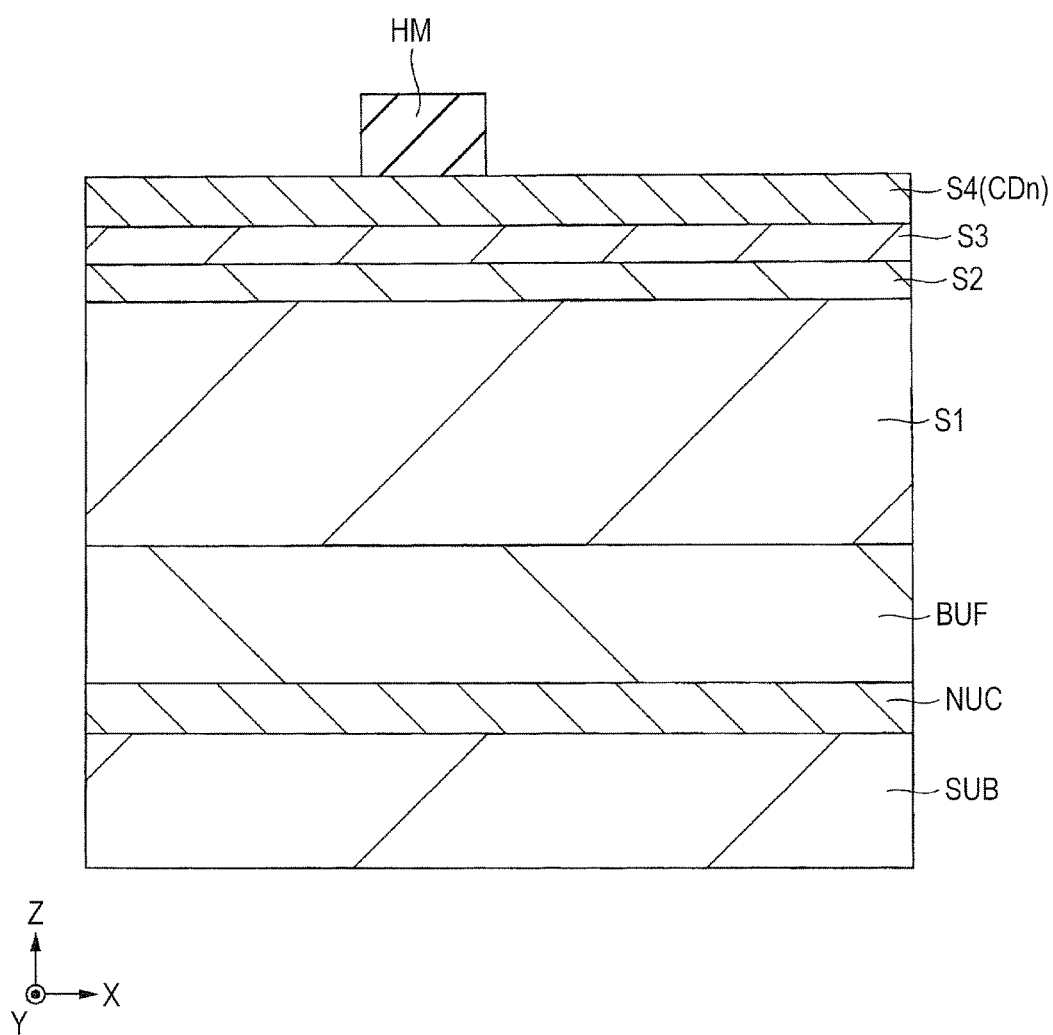
FIG. 8 is a cross-sectional view showing a manufacturing step of the semiconductor device of the first embodiment.

Next, as shown in FIG. 7, the hard mask HM is processed into a desired shape by using photolithography and etching techniques. Specifically, a photoresist film PR1 is formed over the hard mask HM, and the photoresist film PR1 only in a region where the mesa-type fourth nitride semiconductor layer (mesa portion) S4 is formed is remained. Next, the hard mask HM is etched by using the photoresist film PR1 as a mask. Thereafter, the photoresist film PR1 is removed (FIG. 8).

Figure 9:
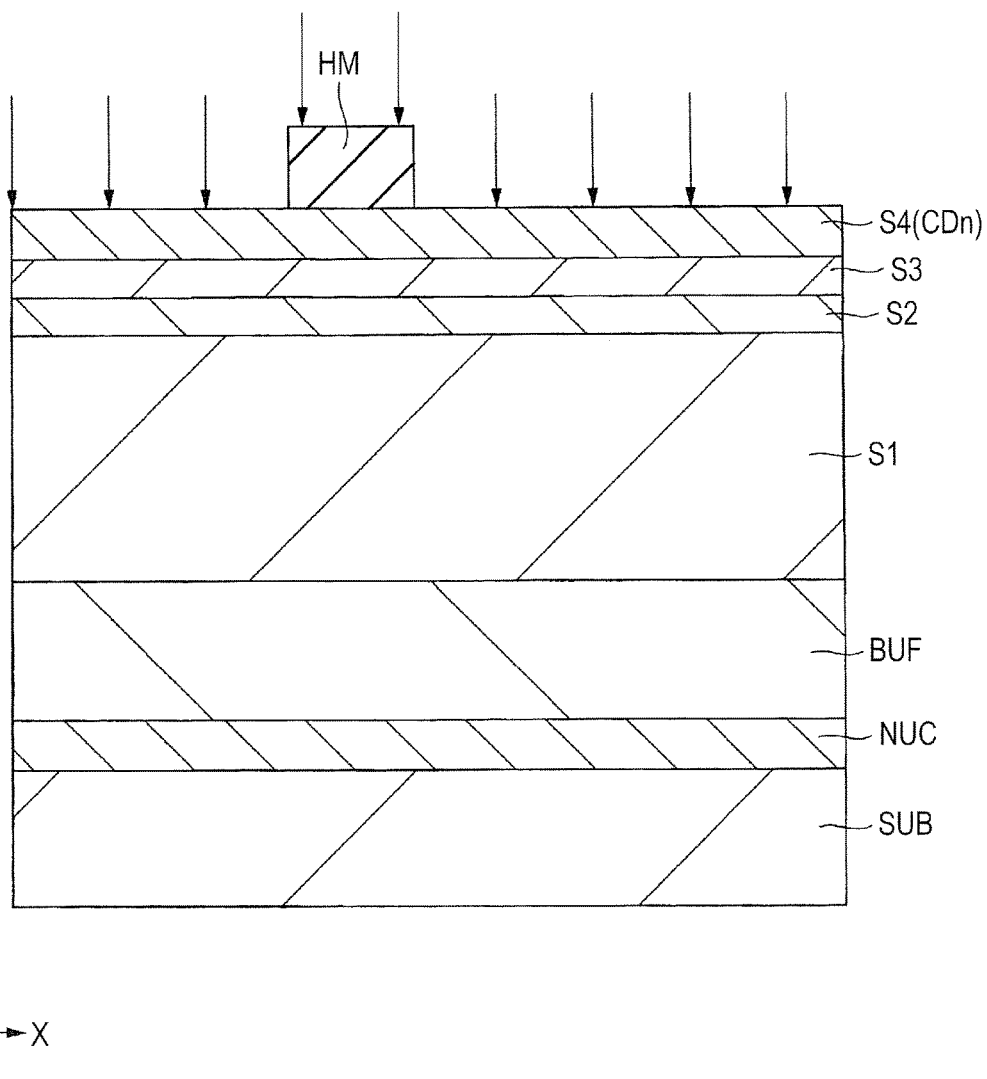
FIG. 9 is a cross-sectional view showing a manufacturing step of the semiconductor device of the first embodiment.
Figure 10:
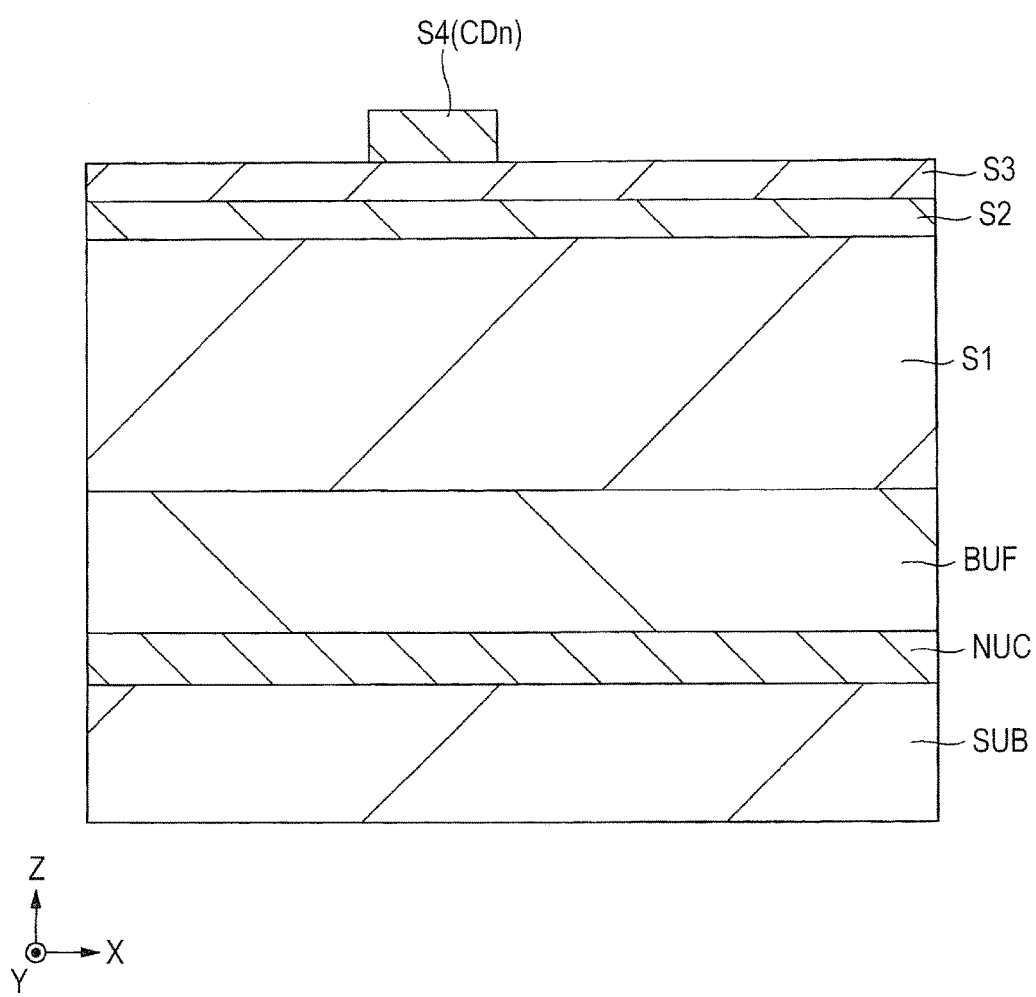
FIG. 10 is a cross-sectional view showing a manufacturing step of the semiconductor device of the first embodiment.

Next, as shown in FIG. 9, the fourth nitride semiconductor layer S4 is etched by using the hard mask HM as a mask. For example, the fourth nitride semiconductor layer S4 is processed by dry etching using a chlorine-based gas (FIG. 10). An operation to etch a lower layer film by using a film of a desired shape as a mask in this way is called patterning. When a fluorine-based gas is added to the chlorine-based gas, an etching selectivity between the third nitride semiconductor layer S3 and the fourth nitride semiconductor layer S4 increases, so that controllability of the etching is improved. Next, the hard mask HM over the mesa-type fourth nitride semiconductor layer S4 is removed. For example, the hard mask HM is removed by dry etching or wet etching.

Figure 11:
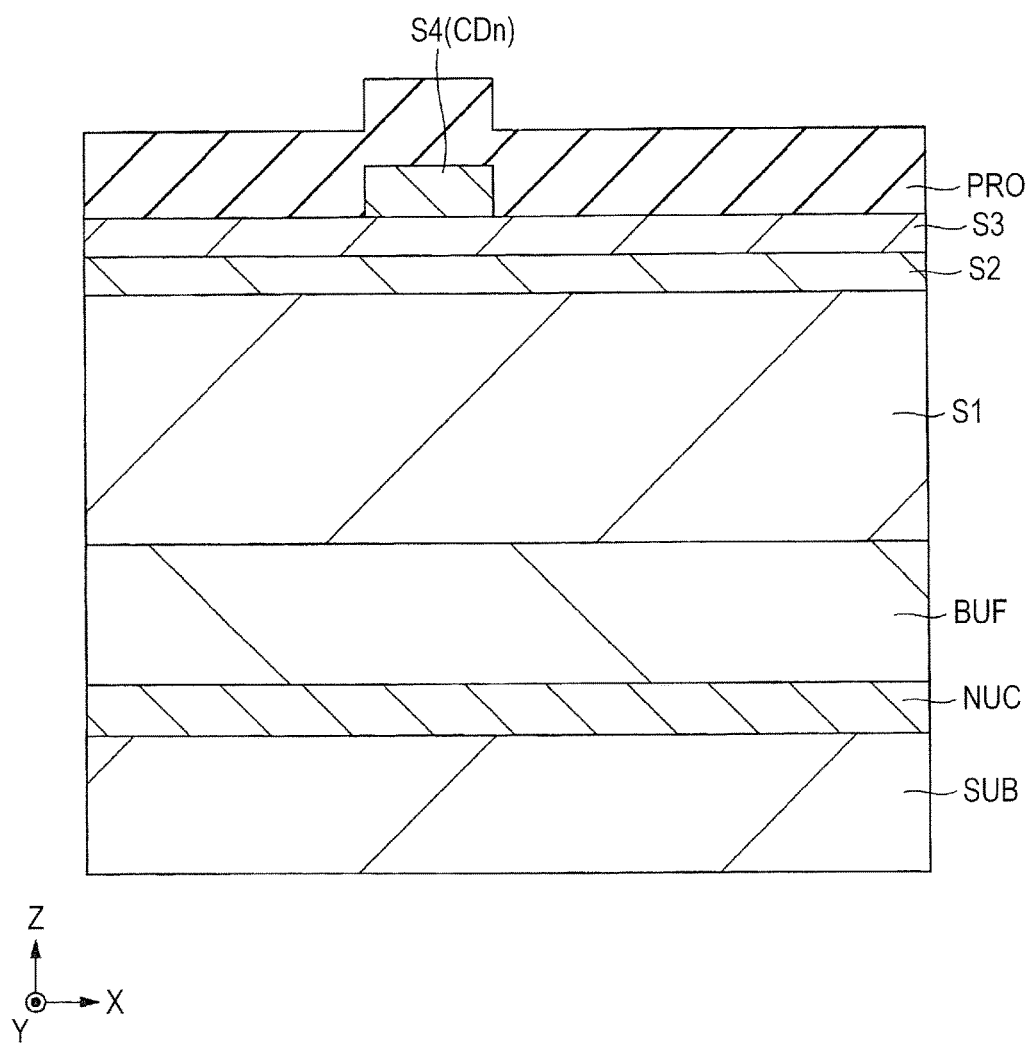
FIG. 11 is a cross-sectional view showing a manufacturing step of the semiconductor device of the first embodiment.

Next, as shown in FIG. 11, the surface protection film PRO is formed over the mesa-type fourth nitride semiconductor layer (mesa portion) S4 and the third nitride semiconductor layer (barrier layer) S3. For example, as the surface protection film PRO, a silicon nitride film is deposited about 100 nm thick by using a plasma CVD method or the like. It is possible to appropriately adjust constituent materials and the film thickness of the surface protection film PRO. It is preferable to select the surface protection film PRO so that the surface protection film PRO satisfies a predetermined dielectric breakdown voltage by considering a gate breakdown voltage and a threshold potential. When selecting a film type having a high dielectric constant, it is possible to increase the film thickness. As the surface protection film PRO, it is possible to use, for example, a silicon oxide film ($SiO_2$ film), a silicon oxynitride film (SiON film), an SiOC film, an aluminum oxide film ($Al_2O_3$ film), a hafnium oxide film ($HfO_2$ film), a zirconium oxide film ($ZrO_2$ film), and the like in addition to a silicon nitride film (SiN film). Further, an organic insulating film may be used. Furthermore, a laminated film consisting of films of two types or more may be used. The forming method of these films is not limited. However, for example, the silicon oxide film can be formed by a thermal CVD method. The aluminum oxide film can be formed by, for example, an ALD (Atomic Layer Deposition) method.

Figure 12:
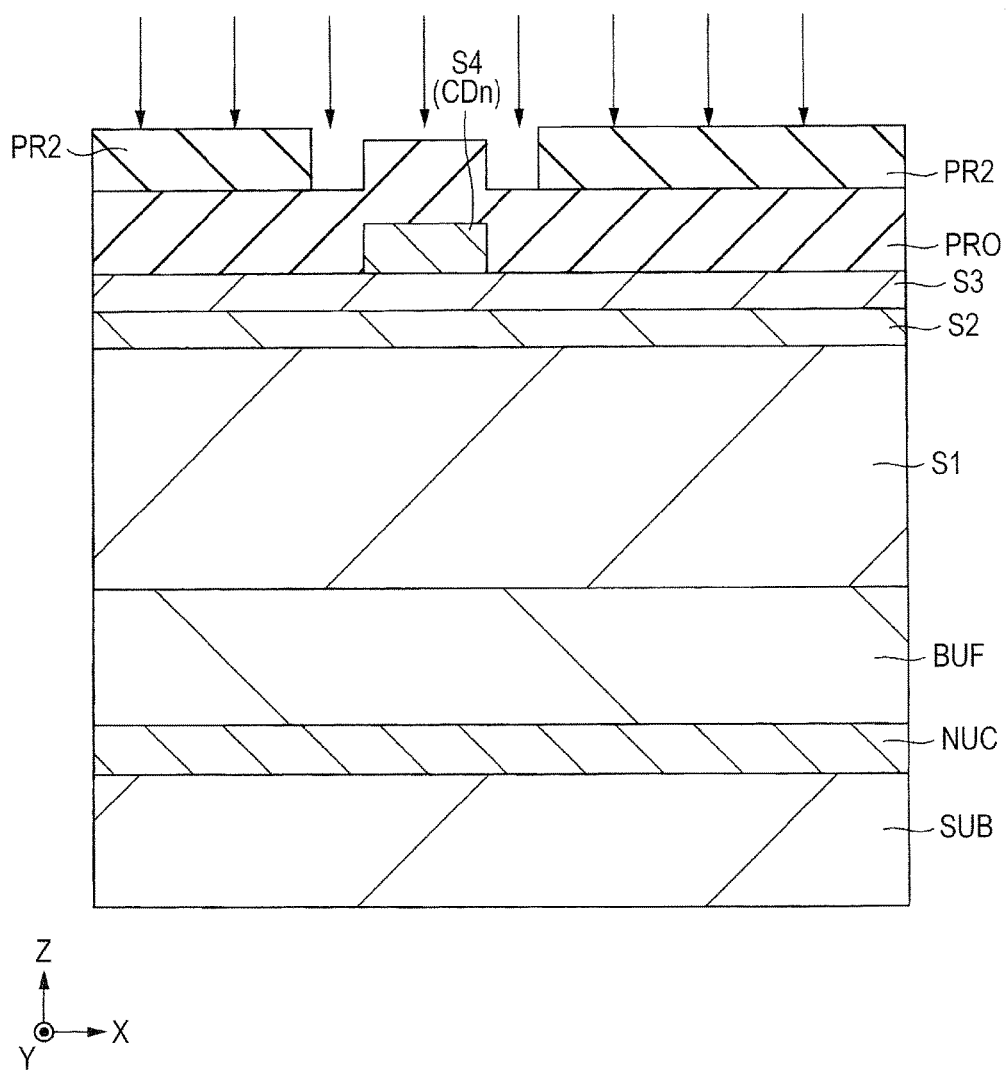
FIG. 12 is a cross-sectional view showing a manufacturing step of the semiconductor device of the first embodiment.
Figure 13:
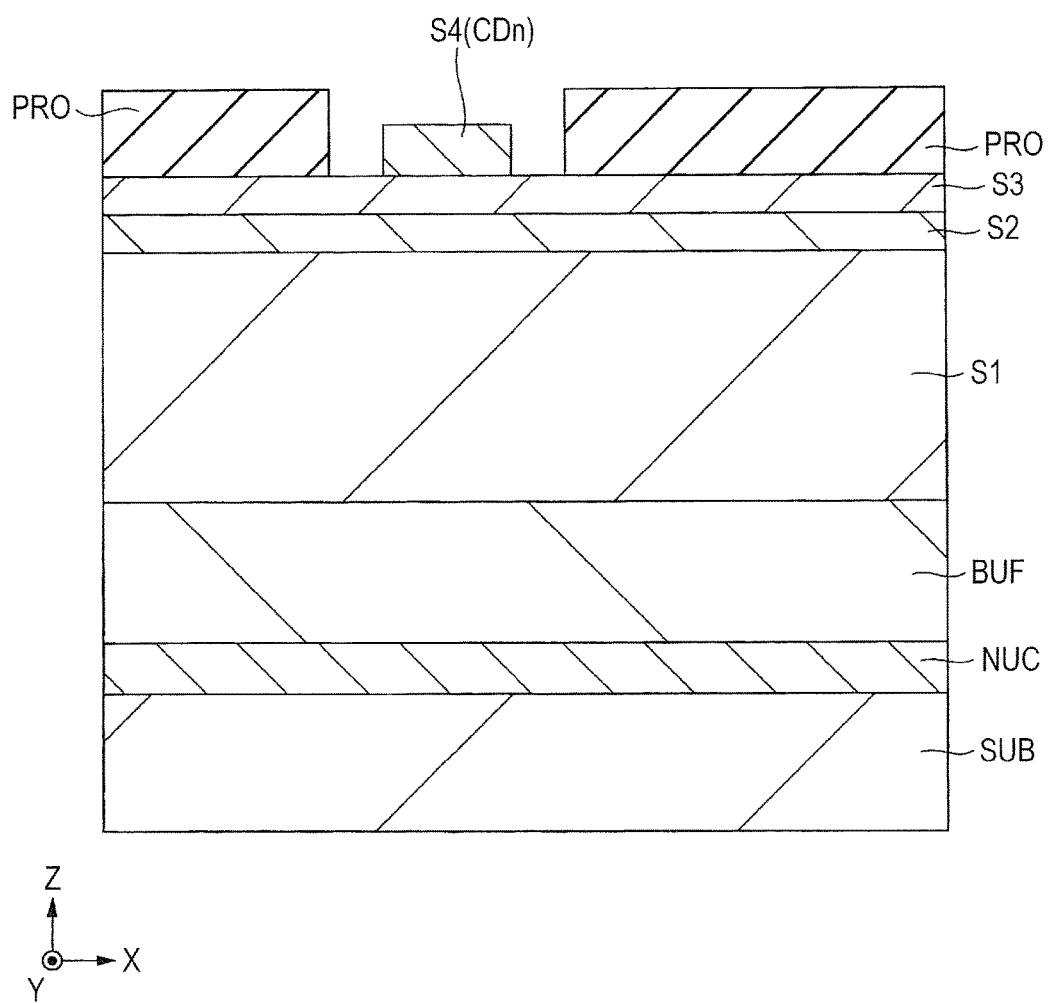
FIG. 13 is a cross-sectional view showing a manufacturing step of the semiconductor device of the first embodiment.

Next, the surface protection film PRO over the mesa-type fourth nitride semiconductor layer (mesa portion) S4 is removed. For example, as shown in FIG. 12, the surface protection film PRO over the mesa-type fourth nitride semiconductor layer (mesa portion) S4 and partial regions of the third nitride semiconductor layer (barrier layer) S3 on both sides of the mesa-type fourth nitride semiconductor layer (mesa portion) S4 is etched by using a photoresist film PR2, which has an opening portion above the mesa-type fourth nitride semiconductor layer (mesa portion) S4, as a mask. Next, the photoresist film PR2 is removed. Thereby, the mesa-type fourth nitride semiconductor layer (mesa portion) S4 and the partial regions of the third nitride semiconductor layer (barrier layer) S3 on both sides of the mesa-type fourth nitride semiconductor layer (mesa portion) S4 are exposed (FIG. 13). In this way, the mesa-type fourth nitride semiconductor layer (mesa portion) S4 and the surface protection film PRO on the right side of FIG. 13 (on a drain electrode side) are arranged separately from each other, and the third nitride semiconductor layer (barrier layer) S3 is exposed from between the fourth nitride semiconductor layer S4 and the surface protection film PRO. Further, the mesa-type fourth nitride semiconductor layer (mesa portion) S4 and the surface protection film PRO on the left side of FIG. 13 (on a source electrode side) are arranged separately from each other, and the third nitride semiconductor layer (barrier layer) S3 is exposed from between the fourth nitride semiconductor layer S4 and the surface protection film PRO.

Figure 14:
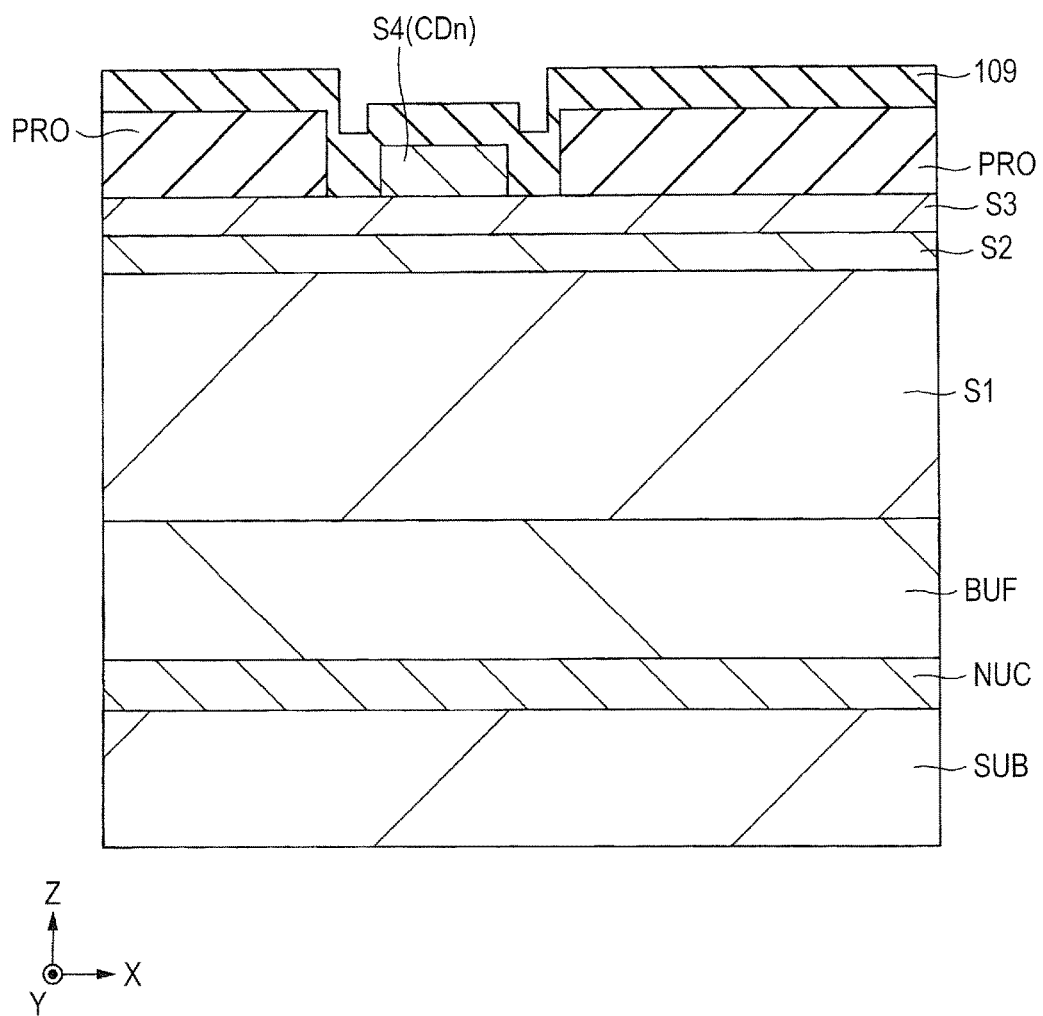
FIG. 14 is a cross-sectional view showing a manufacturing step of the semiconductor device of the first embodiment.

Next, as shown in FIGS. 14 to 17, the gate electrode GE is formed over the mesa-type fourth nitride semiconductor layer (mesa portion) S4 through the gate insulating film GI. For example, as shown in FIG. 14, a silicon oxide film ($SiO_2$ film) 109 is deposited as the gate insulating film GI over the surface protection film PRO including the mesa-type fourth nitride semiconductor layer (mesa portion) S4 and exposed portions of the third nitride semiconductor layer (barrier layer) S3 on both sides of the mesa-type fourth nitride semiconductor layer (mesa portion) S4, with a film thickness of about 30 nm by using an ALD method or the like.

As the gate insulating film GI, in addition to the silicon oxide film, an aluminum oxide film and a high dielectric constant film whose dielectric constant is higher than that of the silicon oxide film may be used. As the high dielectric constant film, it is possible to use an SiN film, an SiON film (silicon oxynitride film), a $ZrO_2$ film (zirconium oxide film), and a hafnium-based insulating film such as an $HfO_2$ film (hafnium oxide film), a hafnium aluminate film, an HfON film (hafnium oxynitride film), an HfAlO (hafnium silicate film), an HfSiON film (hafnium silicon oxynitride film), and an HfAlO film.

Figure 15:
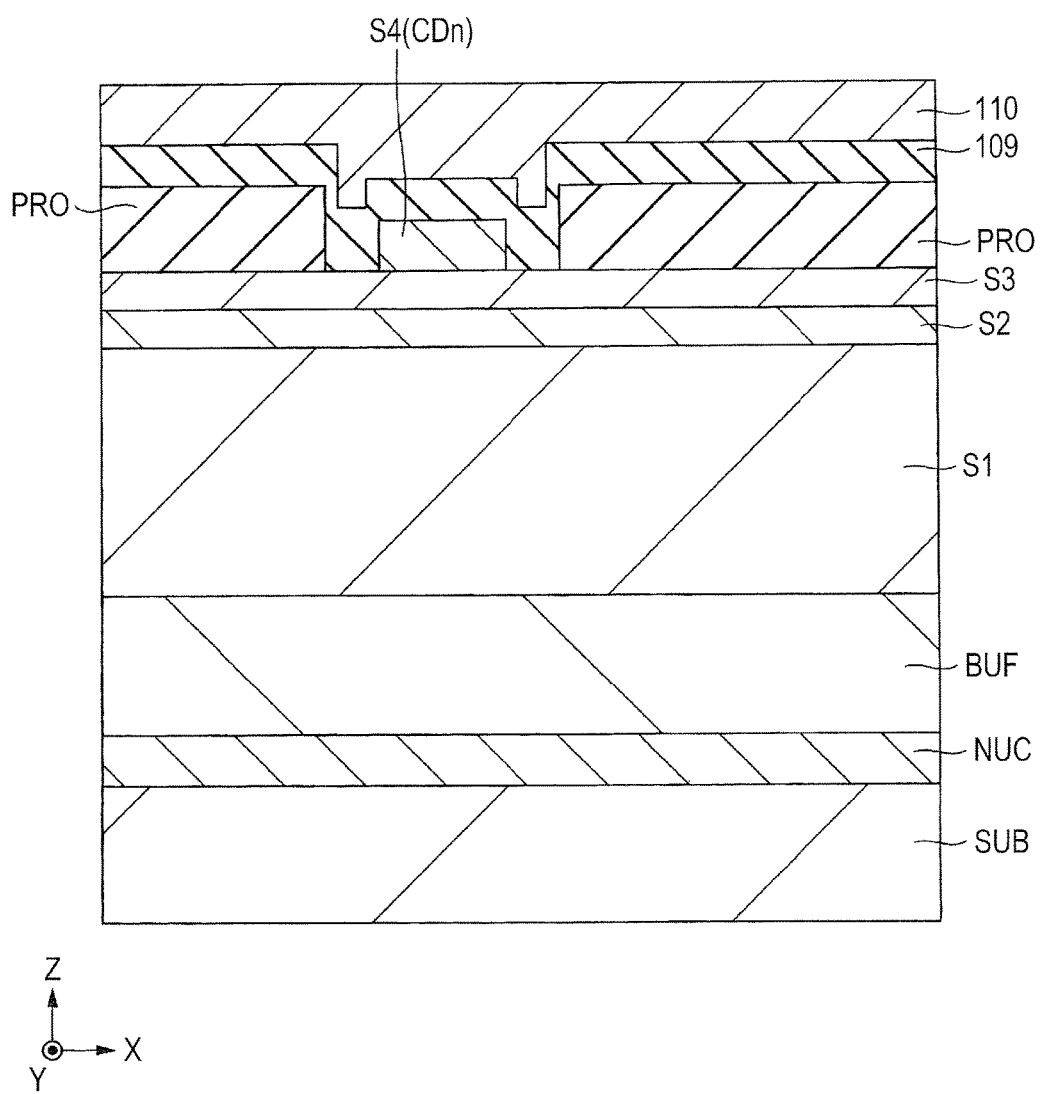
FIG. 15 is a cross-sectional view showing a manufacturing step of the semiconductor device of the first embodiment.

Next, for example, as shown in FIG. 15, as a conductive film (as a constituent material of the gate electrode GE), for example, a TiN (titanium nitride) film 110 is deposited over the gate insulating film GI with a film thickness of about 200 nm by using a sputtering method or the like. It is possible to appropriately adjust constituent materials and the film thickness of the gate electrode GE. As the gate electrode GE, in addition to TiN, it is possible to use a polycrystalline silicon to which a dopant such as B or P is added. Further, it is possible to use Ti, Al, Ni, Pt, Au, a Si compound of these elements, and a N compound of these elements. Furthermore, it is possible to use a multi-layer film where material films of these elements are laminated.

Figure 16:
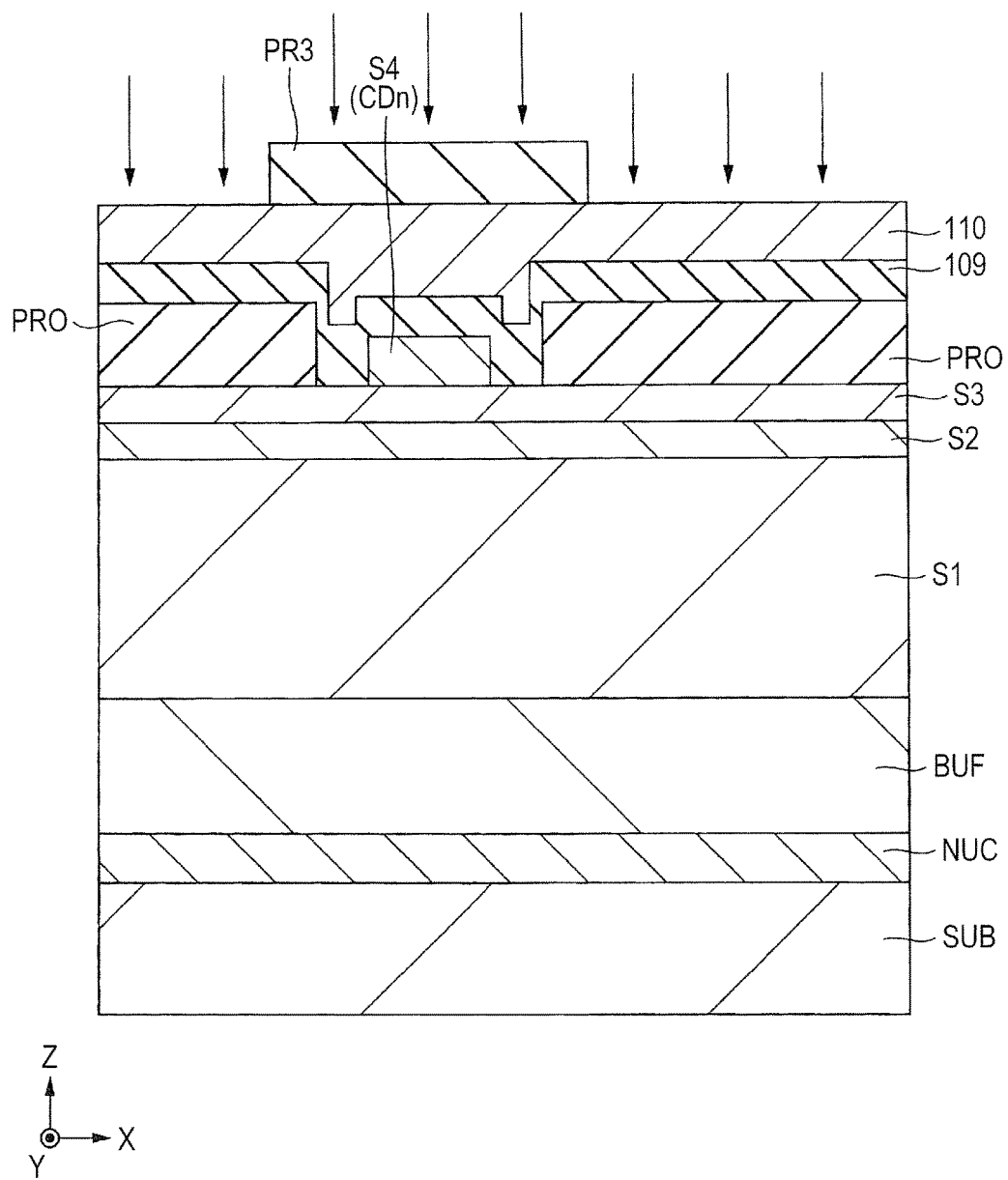
FIG. 16 is a cross-sectional view showing a manufacturing step of the semiconductor device of the first embodiment.
Figure 17:
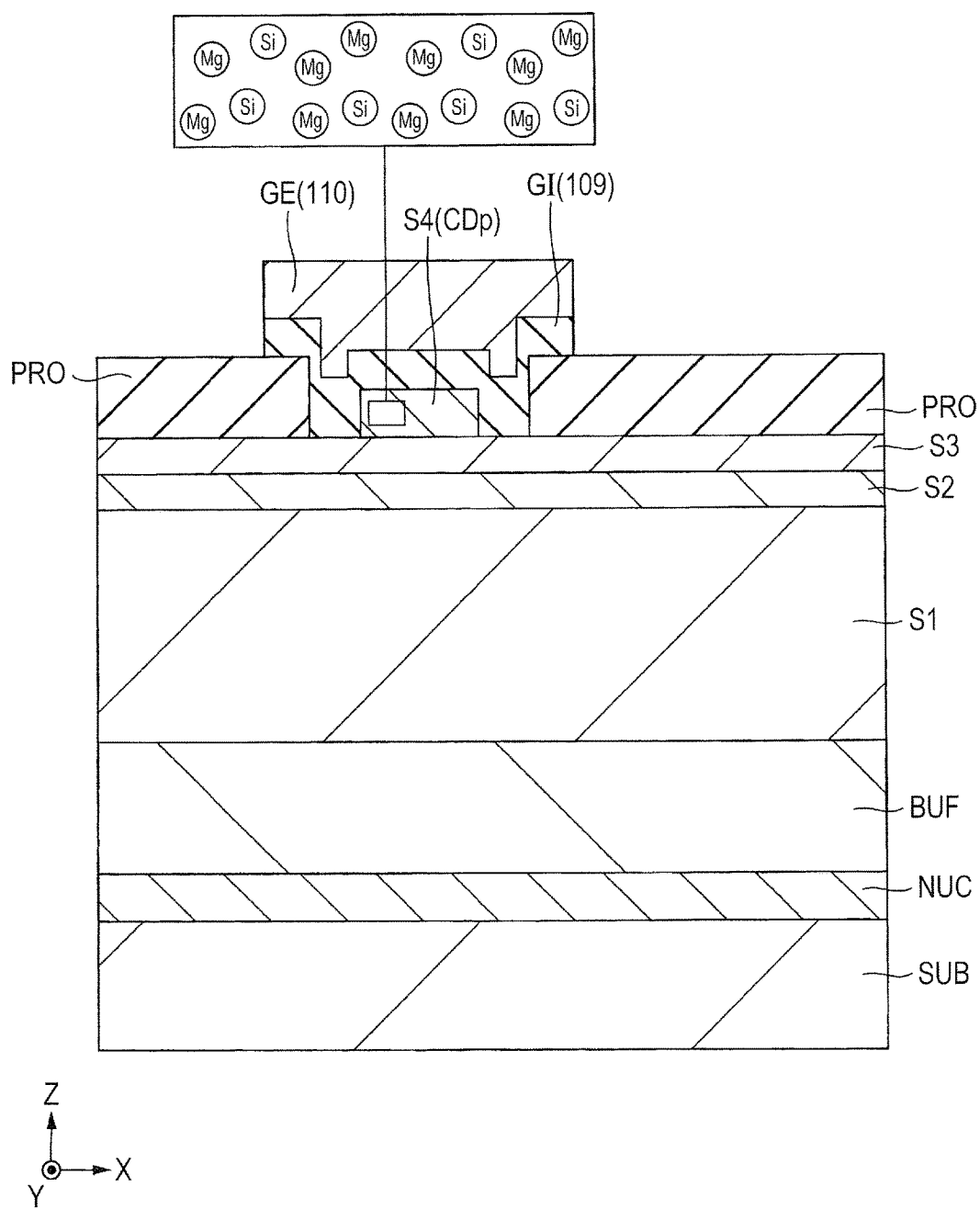
FIG. 17 is a cross-sectional view showing a manufacturing step of the semiconductor device of the first embodiment.

Next, as shown in FIG. 16, a photoresist film PR3 is formed in a gate electrode forming region by using a photolithography technique, and the gate electrode GE is formed by etching the TiN film by using the photoresist mask PR3 as a mask. For example, the TiN film is etched by dry etching using a gas mainly containing $Cl_2$. A fluorine-based gas may be used instead of a chlorine-based gas such as the $Cl_2$. Also, a mixed gas of the chlorine-based gas and the fluorine-based gas may be used. Next, the silicon oxide film under the gate electrode (TiN film) GE is etched. For example, the silicon oxide film is etched by dry etching using a gas mainly containing $CF_4$ (FIG. 17). When processing the gate electrode GE and the gate insulating film GI, the processing is performed so that end portions of a laminated film of the gate electrode GE and the gate insulating film GI overlaps the surface protection film PRO. In other words, the laminated film of the gate electrode GE and the gate insulating film GI is formed so as to cover the mesa-type fourth nitride semiconductor layer (mesa portion) S4 and the exposed portions of the third nitride semiconductor layer (barrier layer) S3 on both sides of the mesa-type fourth nitride semiconductor layer (mesa portion) S4. Thereafter, the photoresist film PR3 is removed.

Next, a heat treatment for activating the p-type impurity (here, Mg) is applied. For example, a heat treatment for 30 minutes at 850° C. is performed in a nitrogen atmosphere. Thereby, the p-type impurity (here, Mg) is activated and the mesa-type fourth nitride semiconductor layer (mesa portion) S4 becomes p-type (FIG. 17). It is possible to appropriately adjust conditions of the activation according to the types and concentrations of the added impurities and the type and thickness of the insulating film. However, it is preferable to employ a condition where the gate insulating film does not change in quality.

Figure 18:
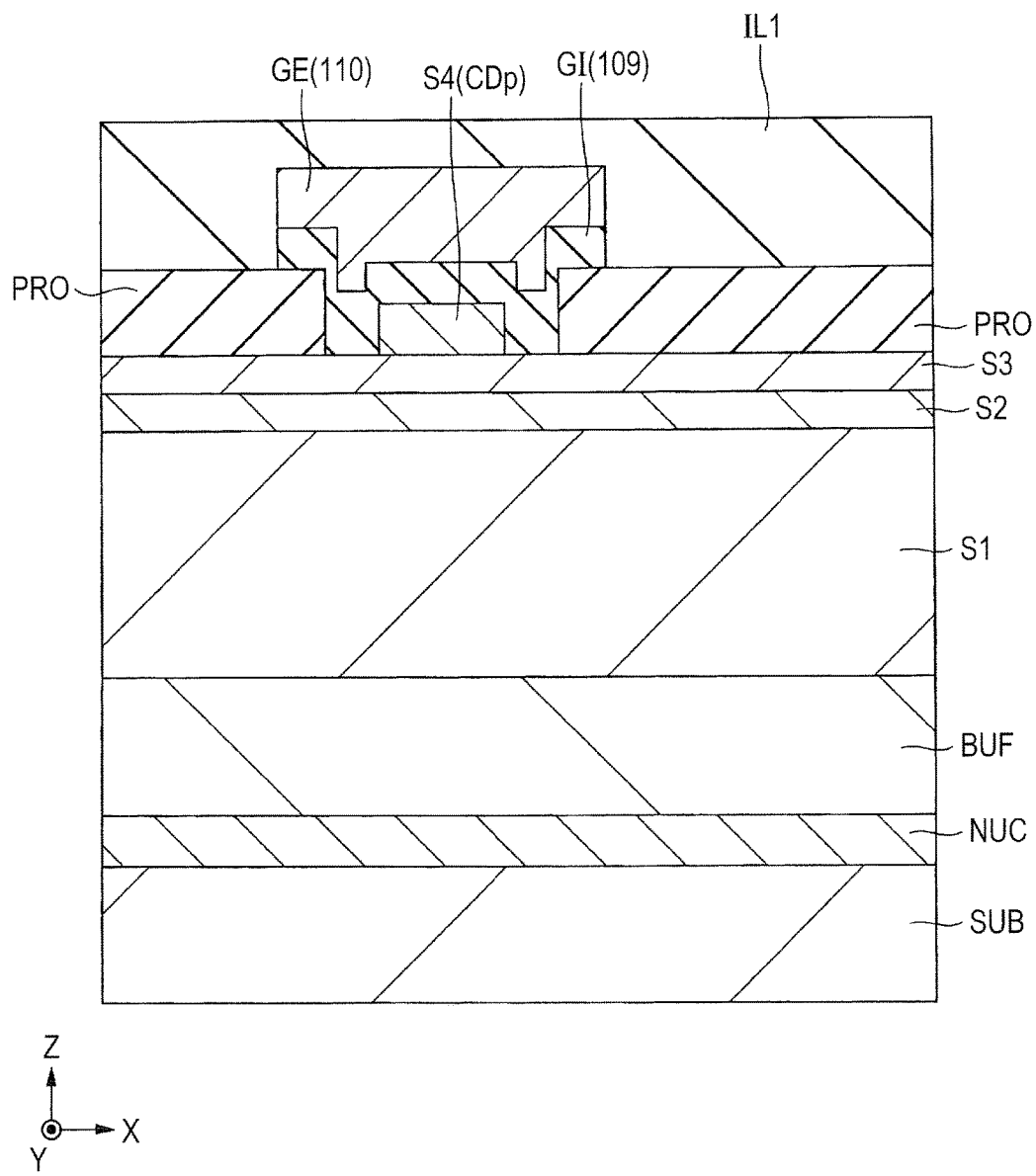
FIG. 18 is a cross-sectional view showing a manufacturing step of the semiconductor device of the first embodiment.
Figure 19:
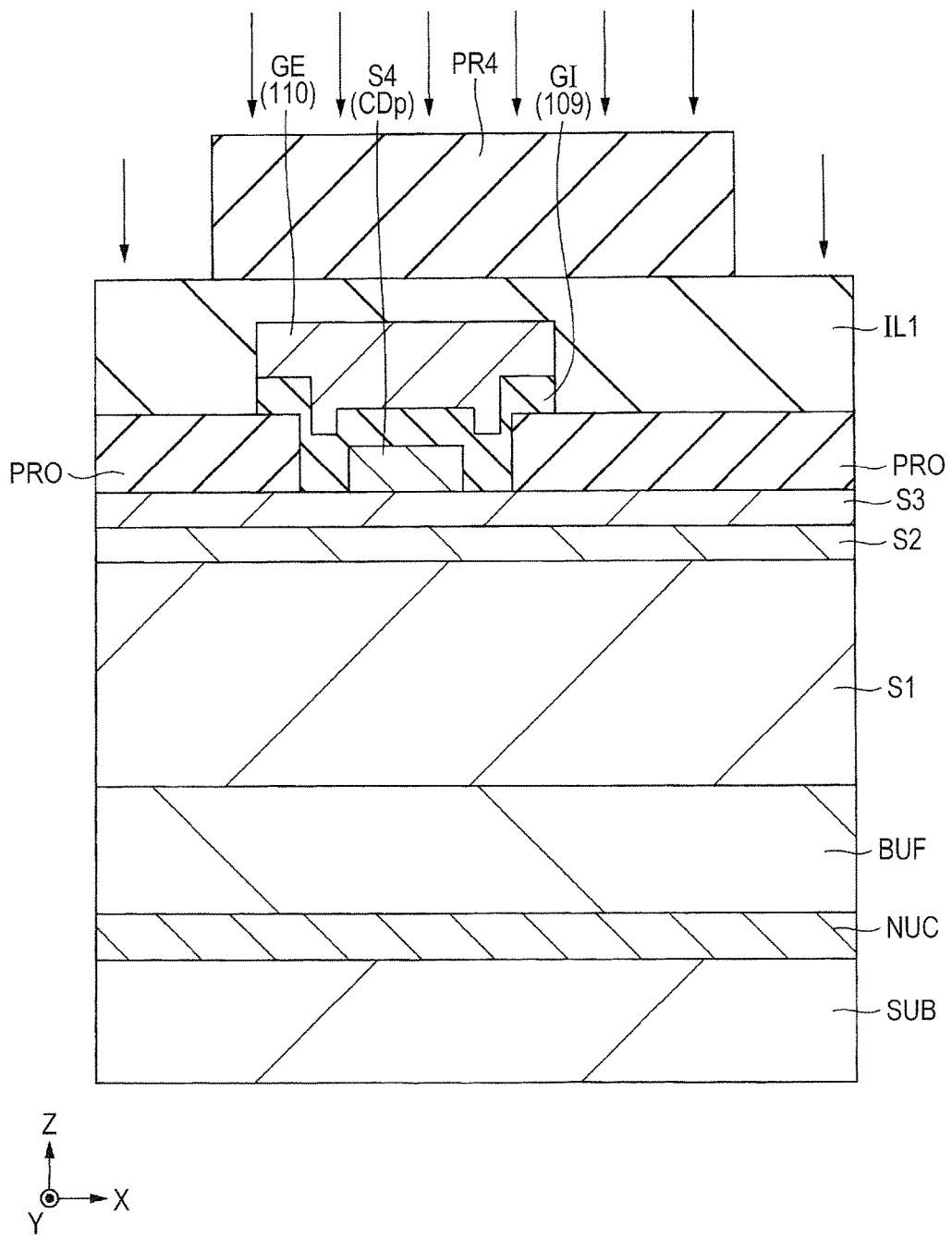
FIG. 19 is a cross-sectional view showing a manufacturing step of the semiconductor device of the first embodiment.
Figure 20:
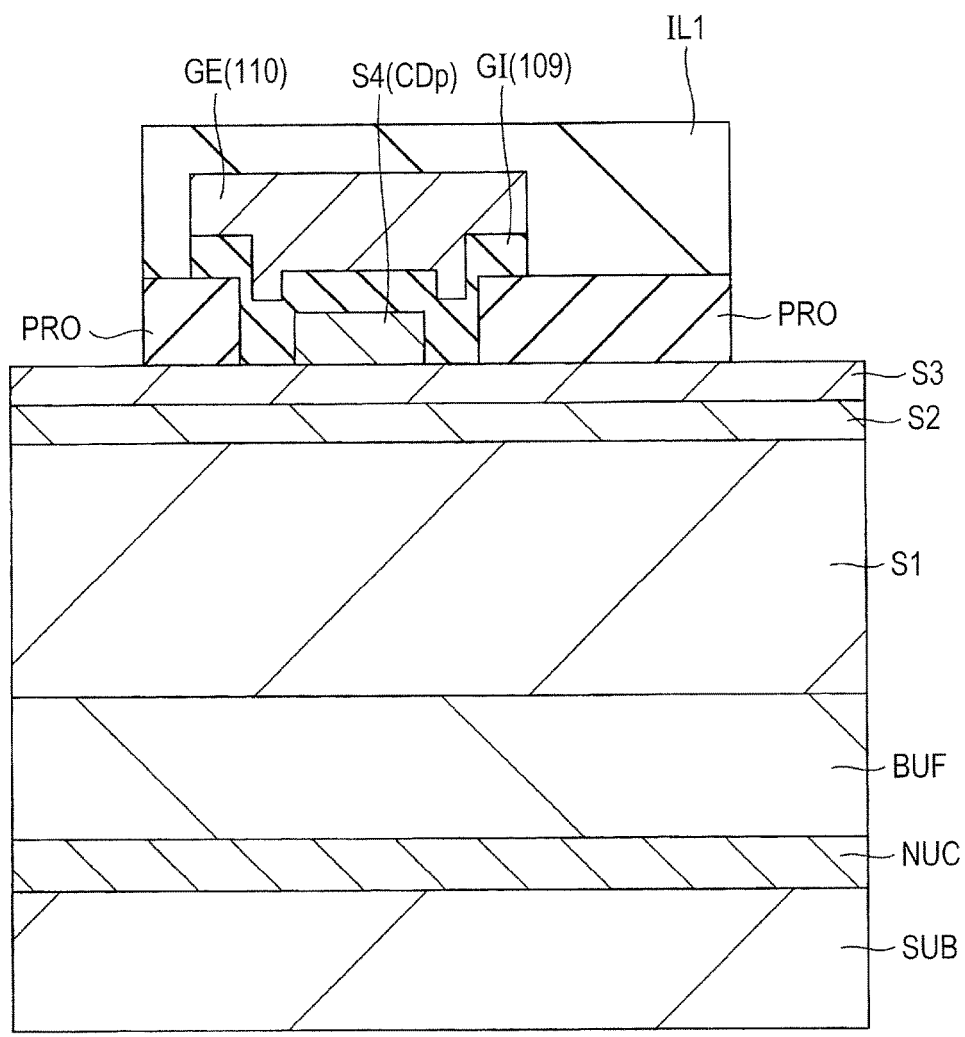
FIG. 20 is a cross-sectional view showing a manufacturing step of the semiconductor device of the first embodiment.

Next, as shown in FIG. 18, the interlayer insulating film IL1 is formed over the gate electrode GE and the surface protection film PRO. For example, as the interlayer insulating film IL1, a silicon oxide film is deposited about 500 nm thick by using the CVD method or the like. As the silicon oxide film, it is possible to use a so-called TEOS film that uses tetraethyl orthosilicate as a raw material. Next, a contact hole is formed in the interlayer insulating film IL1 by using photolithography and etching techniques. For example, as shown in FIG. 19, a photoresist film PR4, which has an opening portion in each of a source electrode coupling region and a drain electrode coupling region, is formed over the interlayer insulating film IL1. Next, the contact hole is formed by etching the interlayer insulating film IL1 and the surface protection film PRO by using the photoresist film PR4 as a mask. For example, the interlayer insulating film IL1 is etched by dry etching using a gas (fluorine-based gas) mainly containing $SF_6$. Thereafter, the photoresist film PR4 is removed. Thereby, the third nitride semiconductor layer (barrier layer) S3 of the source electrode coupling region and the drain electrode coupling region located on both sides of the gate electrode GE is exposed (FIG. 20).

Figure 21:
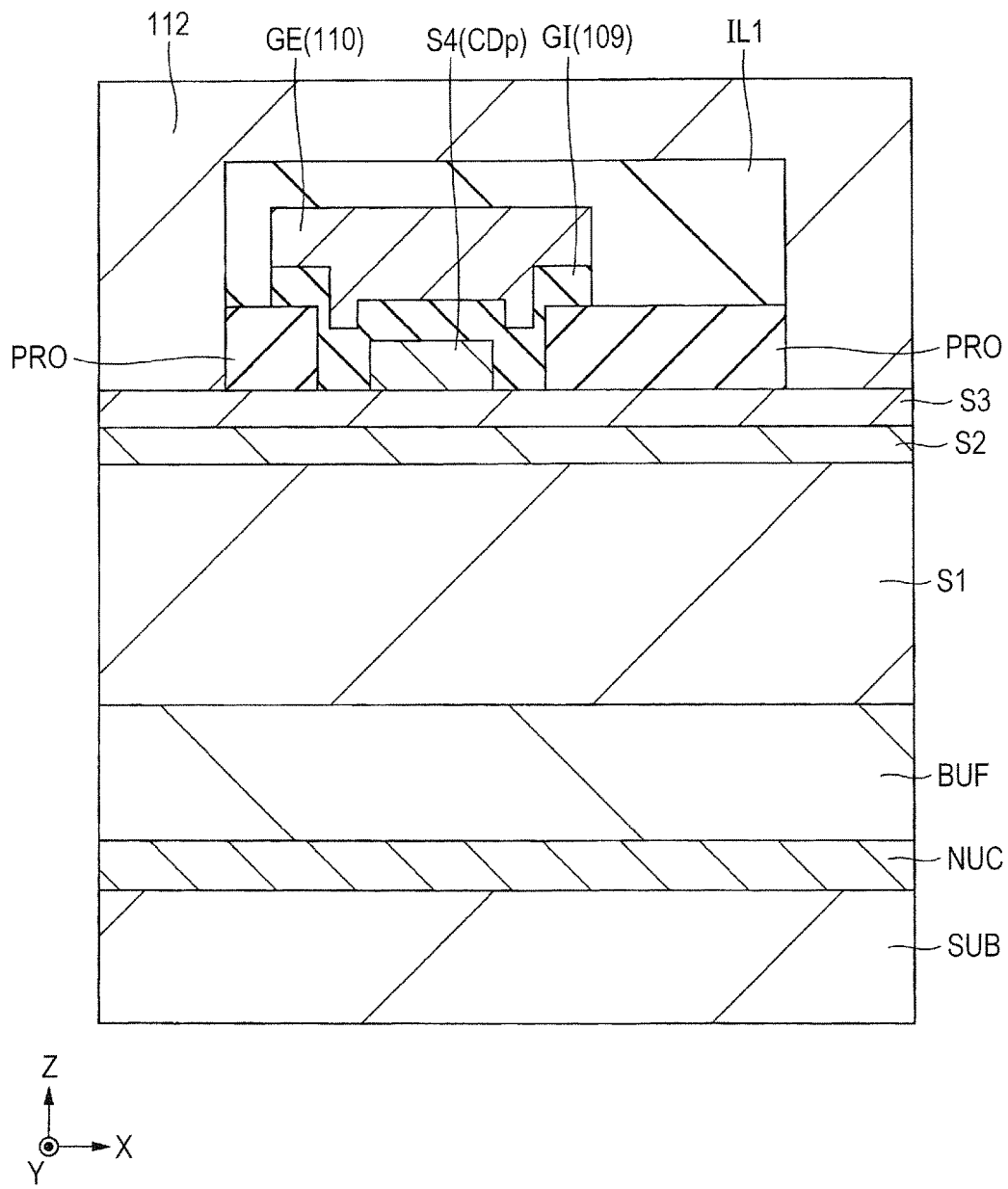
FIG. 21 is a cross-sectional view showing a manufacturing step of the semiconductor device of the first embodiment.
Figure 22:
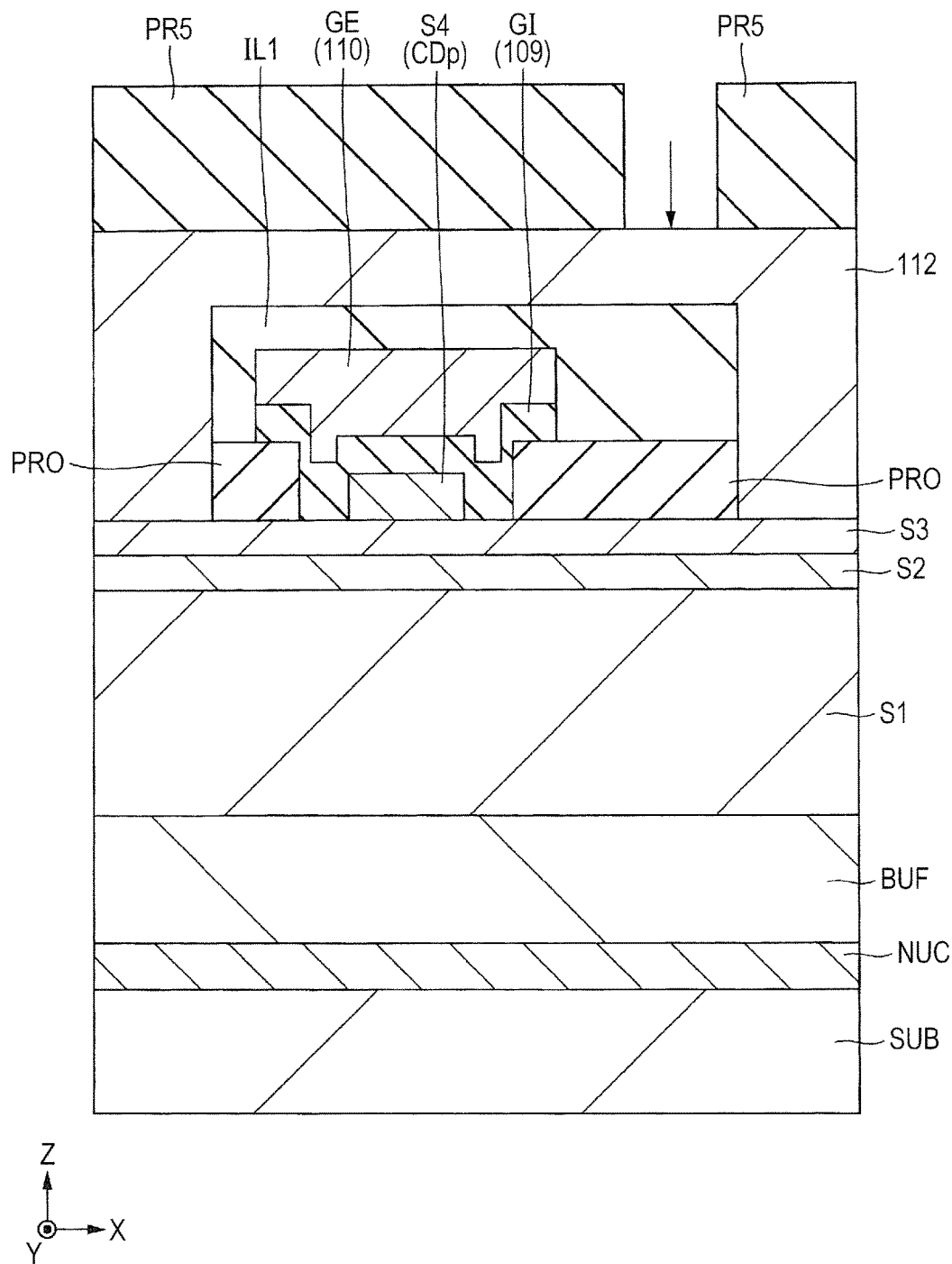
FIG. 22 is a cross-sectional view showing a manufacturing step of the semiconductor device of the first embodiment.

Next, as shown in FIGS. 21 and 22, the source electrode SE and the drain electrode DE are formed over the source electrode coupling region and the drain electrode coupling region. For example, as shown in FIG. 21, a conductive film 112 is formed over the interlayer insulating film IL1 including the inside of the contact hole. For example, an Al/Ti film is formed as the conductive film. For example, a Ti film is formed with a film thickness of about 50 nm over the interlayer insulating film IL1 including the inside of the contact hole by using a sputtering method or the like, and further an Al film is formed with a film thickness of about 1000 nm over the Ti film by using a sputtering method or the like. Thereafter, a heat treatment is applied. For example, a heat treatment for 30 minutes at 500° C. is performed. Thereby, an ohmic contact can be formed between the conductive film (Al/Ti film) and a layer under the conductive film.

Figure 23:
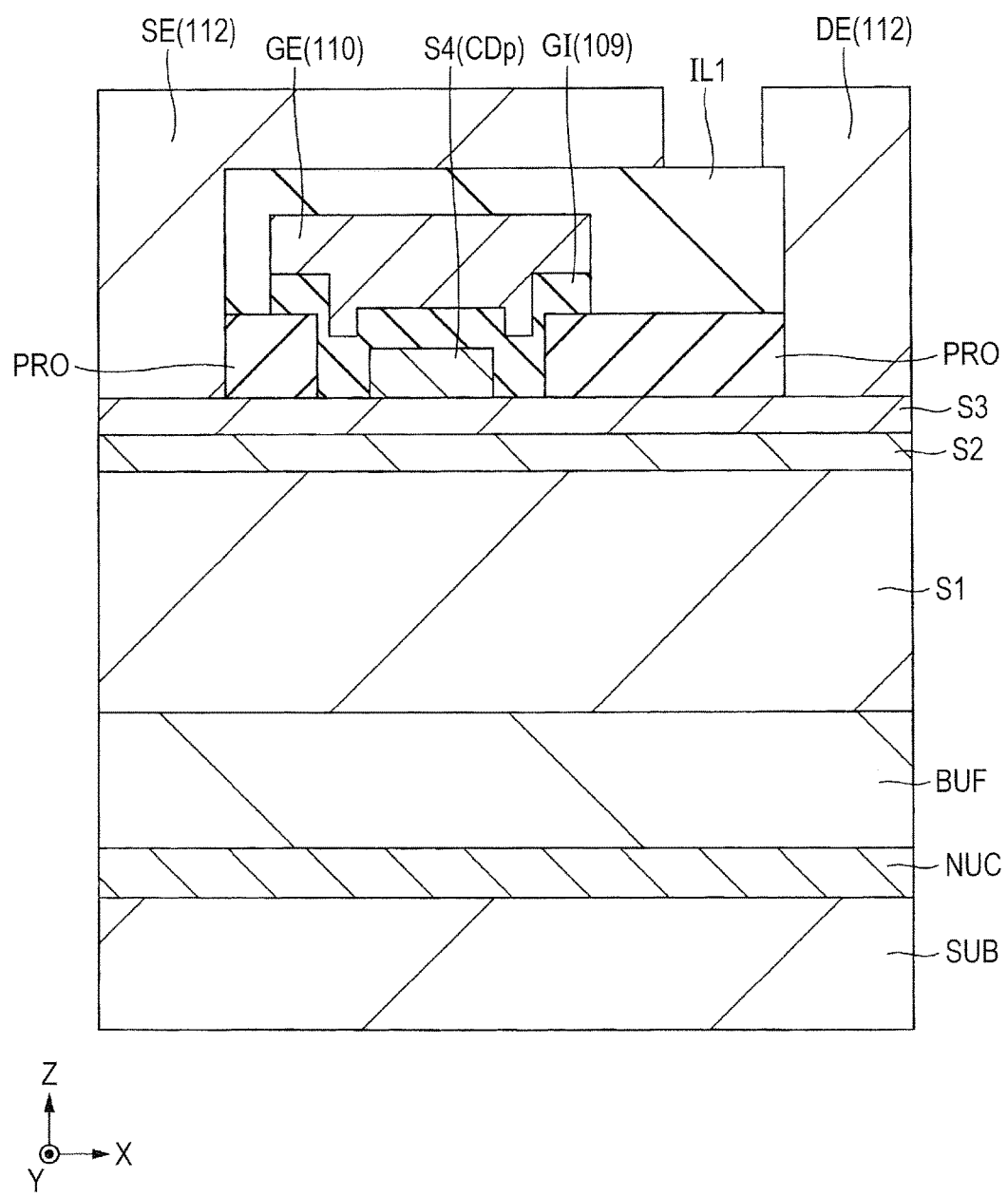
FIG. 23 is a cross-sectional view showing a manufacturing step of the semiconductor device of the first embodiment.

Next, as shown in FIG. 22, a photoresist film PR5 is formed informing regions of the source electrode SE and the drain electrode DE, and the conductive film (Al/Ti film) is etched by using the photoresist film PR5 as a mask. For example, the conductive film (Al/Ti film) is etched by dry etching using a gas mainly containing $Cl_2$. Thereafter, the photoresist film PR5 is removed. Thereby, it is possible to form the source electrode SE and the drain electrode DE (FIG. 23). Here, the source electrode SE is patterned so as to extend above the gate electrode GE. A portion which is a part of the source electrode SE and is located above the gate electrode GE may be referred to as a field plate.

It is possible to appropriately adjust constituent materials and the film thickness of the conductive film that forms the source electrode SE and the drain electrode DE. As such a conductive film, it is preferable to use a material that comes into ohmic contact with a nitride semiconductor layer.

Thereafter, an insulating film may be formed over the interlayer insulating film IL1 including a portion over the source electrode SE and the drain electrode DE, and further, an upper layer wiring may be formed. Over an uppermost layer wiring, a protection film formed of an insulating film may be formed.

By the steps described above, it is possible to form the semiconductor device of the present embodiment. The steps described above are an example, and the semiconductor device of the present embodiment may be manufactured by steps other than the steps described above.

Second Embodiment

In the first embodiment, the fourth nitride semiconductor layer (mesa portion) S4 is formed over the third nitride semiconductor layer S3. However, the fourth nitride semiconductor layer (mesa portion) S4 may be formed over the third nitride semiconductor layer S3 through a fifth nitride semiconductor layer CAP.

[Description of Structure]

Figure 24:
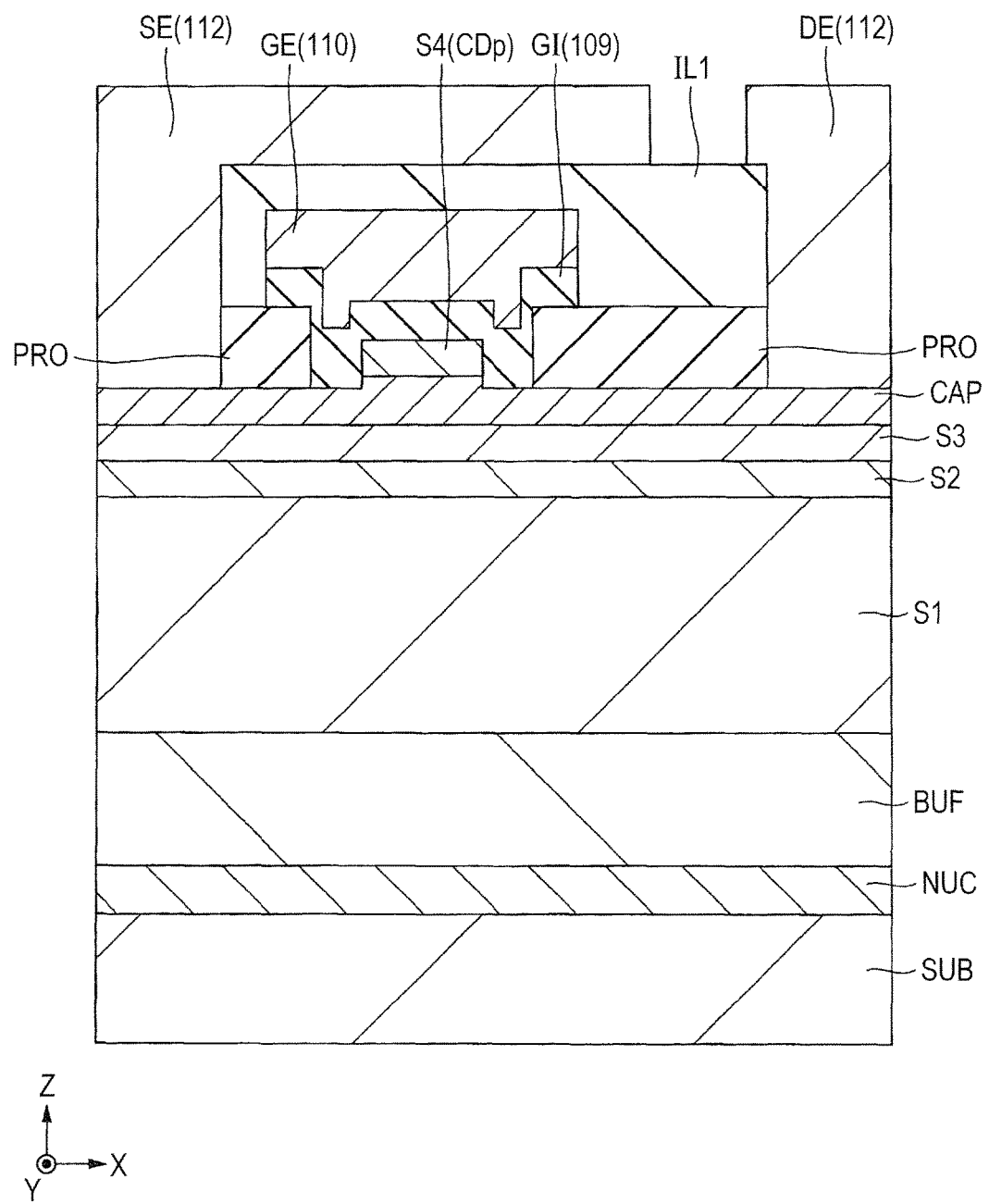
FIG. 24 is a cross-sectional view showing a configuration of a semiconductor device of a second embodiment.

FIG. 24 is a cross-sectional view showing a configuration of a semiconductor device of the second embodiment. The present embodiment is the same as the first embodiment except that the present embodiment has a configuration in which the fifth nitride semiconductor layer CAP is located between the third nitride semiconductor layer S3 and the fourth nitride semiconductor layer (mesa portion) S4. Therefore, a description other than for the configuration will be omitted.

The fifth nitride semiconductor layer CAP is also called a cap layer and is formed of, for example, GaN.

[Description of Manufacturing Method]

For example, until the third nitride semiconductor layer S3, the semiconductor device is manufactured in the same manner as in the first embodiment. Next, over the third nitride semiconductor layer S3, as the fifth nitride semiconductor layer CAP, a GaN layer is epitaxially grown by about 5 nm by using the metal organic chemical vapor deposition method or the like. No impurity is intentionally doped into the fifth nitride semiconductor layer CAP. It is possible to appropriately adjust constituent materials and the film thickness of the fifth nitride semiconductor layer CAP.

Next, in the same manner as in the first embodiment, the fourth nitride semiconductor layer (co-doped layer) S4 is formed over the fifth nitride semiconductor layer CAP, and the fourth nitride semiconductor layer S4 is etched by using the hard mask HM as a mask (see FIG. 10). When the fourth nitride semiconductor layer S4 is etched, if the fourth nitride semiconductor layer (co-doped layer) S4 and the fifth nitride semiconductor layer CAP below the fourth nitride semiconductor layer S4 are formed of the same material (here, GaN), etching time is calculated from etching rate and the etching is completed in the calculated etching time.

Thereafter, in the same manner as in the first embodiment, the surface protection film PRO is formed, and then the gate electrode GE is formed over the mesa-type fourth nitride semiconductor layer (mesa portion) S4 through the gate insulating film GI, and furthermore the interlayer insulating film IL1, the source electrode SE, and the drain electrode DE are formed.

As described above, according to the present embodiment, it is possible to suppress change in quality of the surface of the third nitride semiconductor layer S3 by the fifth nitride semiconductor layer CAP. In particular, when the third nitride semiconductor layer S3 contains Al, the third nitride semiconductor layer S3 is easily oxidized. Further, fluoridization may be caused by an etching liquid. Such undesired oxide film and fluoride film may affect characteristics of the semiconductor device. For example, it is difficult to control an interface state of an insulating film—semiconductor interface between the gate electrode and the source electrode and between the gate electrode and the drain electrode, so that there is a risk that the characteristics of the semiconductor device is destabilized. On the other hand, as in the present embodiment, by providing the fifth nitride semiconductor layer CAP over the third nitride semiconductor layer S3, it is possible to easily control the interface state of an insulating film—semiconductor interface between the gate electrode and the source electrode and between the gate electrode and the drain electrode, so that the characteristics of the semiconductor device can be stabilized.

Further, also in the present embodiment, the mesa-type fourth nitride semiconductor layer (mesa portion) is the co-doped layer. Thereby, as described in the first embodiment, it is possible to improve the threshold potential and to improve the normally-off characteristics. Further, the fourth nitride semiconductor layer S4 is n-type until the gate insulating film is formed over the fourth nitride semiconductor layer S4, and the fourth nitride semiconductor layer S4 is made neutral or p-type after the gate insulating film is formed. Thereby, it is possible to improve the threshold potential and improve the normally-off characteristics.

Third Embodiment

Figure 25:
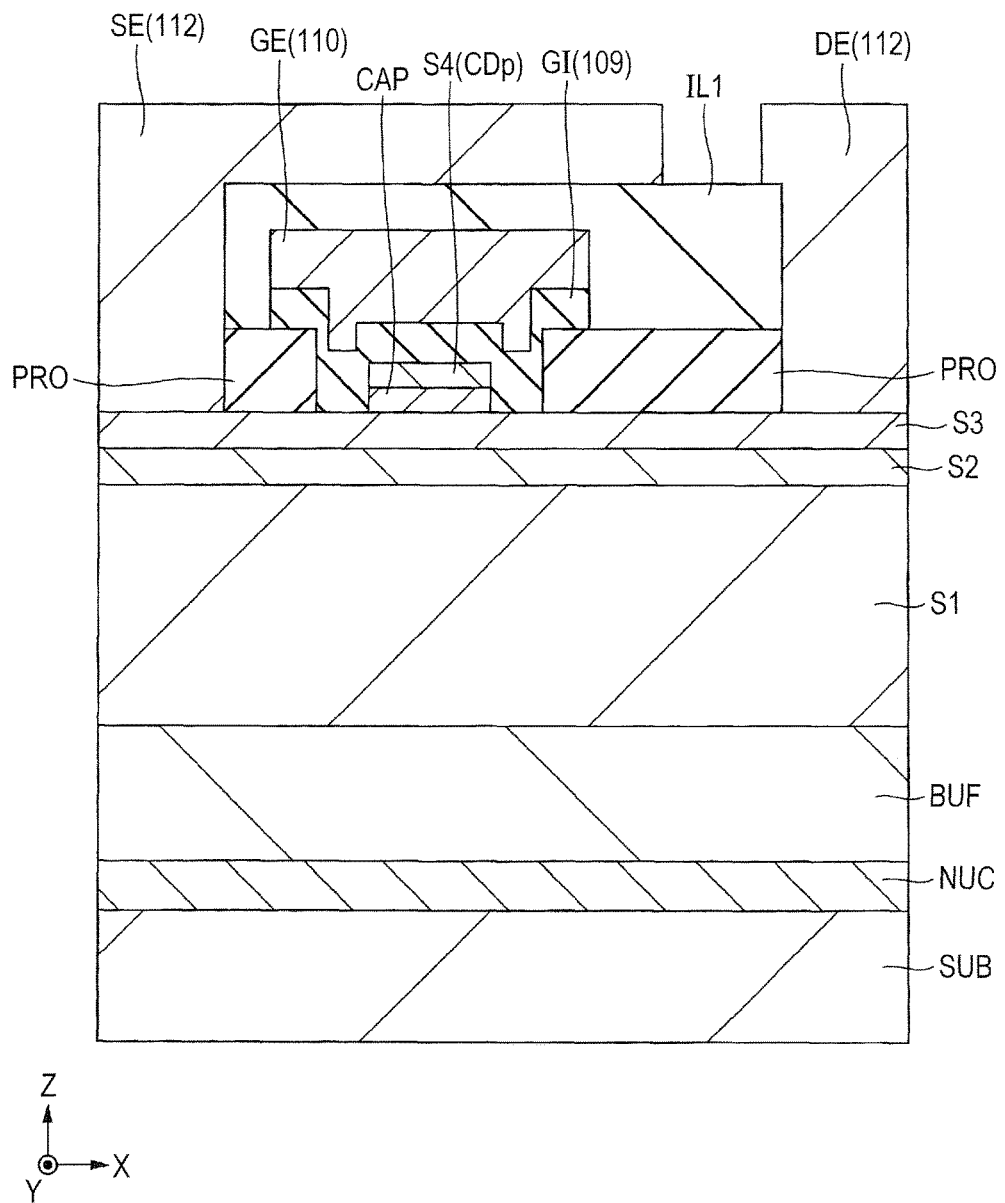
FIG. 25 is a cross-sectional view showing a configuration of a semiconductor device of a third embodiment.

In the first embodiment described above, the fourth nitride semiconductor layer (mesa portion) S4 is a single layer. However, the fourth nitride semiconductor layer (mesa portion) may be a laminated layer.
[Description of Structure]
FIG. 25 is a cross-sectional view showing a configuration of a semiconductor device of the third embodiment. In the present embodiment, a mesa portion that is a laminated body of the fifth nitride semiconductor layer CAP and the fourth nitride semiconductor layer S4 is formed over the third nitride semiconductor layer S3. The present embodiment is the same as the first embodiment except for the mesa portion, so that the description for other than the mesa portion will be omitted.

The fifth nitride semiconductor layer CAP is formed of, for example, GaN.

[Description of Manufacturing Method]
For example, until the third nitride semiconductor layer S3, the semiconductor device is manufactured in the same manner as in the first embodiment. Next, over the third nitride semiconductor layer S3, as the fifth nitride semiconductor layer CAP, a GaN layer is epitaxially grown by about 5 nm by using the metal organic chemical vapor deposition method or the like. No impurity is intentionally doped into the fifth nitride semiconductor layer CAP. It is possible to appropriately adjust constituent materials and the film thickness of the fifth nitride semiconductor layer CAP.

Next, in the same manner as in the first embodiment, the fourth nitride semiconductor layer (co-doped layer) S4 is formed over the fifth nitride semiconductor layer CAP. Next, a hard mask is remained in a forming region of the mesa portion, and the fourth nitride semiconductor layer S4 and fifth nitride semiconductor layer CAP are etched by using the hard mask as a mask. By this etching, a mesa portion formed of a laminated body of the fifth nitride semiconductor layer CAP and the fourth nitride semiconductor layer S4 is formed.

Thereafter, in the same manner as in the first embodiment, the surface protection film PRO is formed, and then the gate electrode GE is formed over the mesa portion (the laminated body of the fifth nitride semiconductor layer CAP and the fourth nitride semiconductor layer S4) through the gate insulating film GI, and furthermore the interlayer insulating film IL1, the source electrode SE, and the drain electrode DE are formed.

As described above, according to the present embodiment, it is possible to reduce the film thickness of the fourth nitride semiconductor layer (co-doped layer) S4 to smaller than that in the first embodiment. Therefore, it is possible to introduce impurities (p-type impurity and n-type impurity) in high concentration into the fourth nitride semiconductor layer (co-doped layer) S4. It may be difficult to stably introduce a low-concentration impurity into a film, and as described above, it is preferable that the concentration of the p-type impurity (here, Mg) is within a range of $5 \times 10^{17}$ cm$^{-3}$ to $2 \times 10^{19}$ cm$^{-3}$ and the concentration of the n-type impurity (here, Si) is within a range of $5 \times 10^{16}$ cm$^{-3}$ to $2 \times 10^{18}$ cm$^{-3}$.

Therefore, according to the present embodiment, it is possible to easily adjust the concentrations of the impurities (p-type impurity and n-type impurity) in the fourth nitride semiconductor layer (co-doped layer) S4 while maintaining the height of the mesa portion.

Further, also in the present embodiment, the mesa-type fourth nitride semiconductor layer (mesa portion) is the co-doped layer. Thereby, as described in the first embodiment, it is possible to improve the threshold potential and to improve the normally-off characteristics. Further, the fourth nitride semiconductor layer S4 is n-type until the gate insulating film is formed over the fourth nitride semiconductor layer S4, and the fourth nitride semiconductor layer S4 is made neutral or p-type after the gate insulating film is formed. Thereby, it is possible to improve the threshold potential and improve the normally-off characteristics.

Fourth Embodiment

In the first embodiment described above, the laminated body of the gate electrode GE and the gate insulating film GI is formed so as to cover the mesa-type fourth nitride semiconductor layer (mesa portion) S4 and the exposed portions of the third nitride semiconductor layer (barrier layer) S3 on both sides of the mesa-type fourth nitride semiconductor layer (mesa portion) S4. In other words, a planar shape of the laminated body of the gate electrode GE and the gate insulating film GI is formed into a shape one size larger than a planar shape of the mesa-type fourth nitride semiconductor layer (mesa portion) S4. On the other hand, in the present embodiment, the planar shape of the laminated body of the gate electrode GE and the gate insulating film GI is substantially the same as the planar shape of the mesa-type fourth nitride semiconductor layer (mesa portion) S4.

[Description of Structure]

Figure 26:
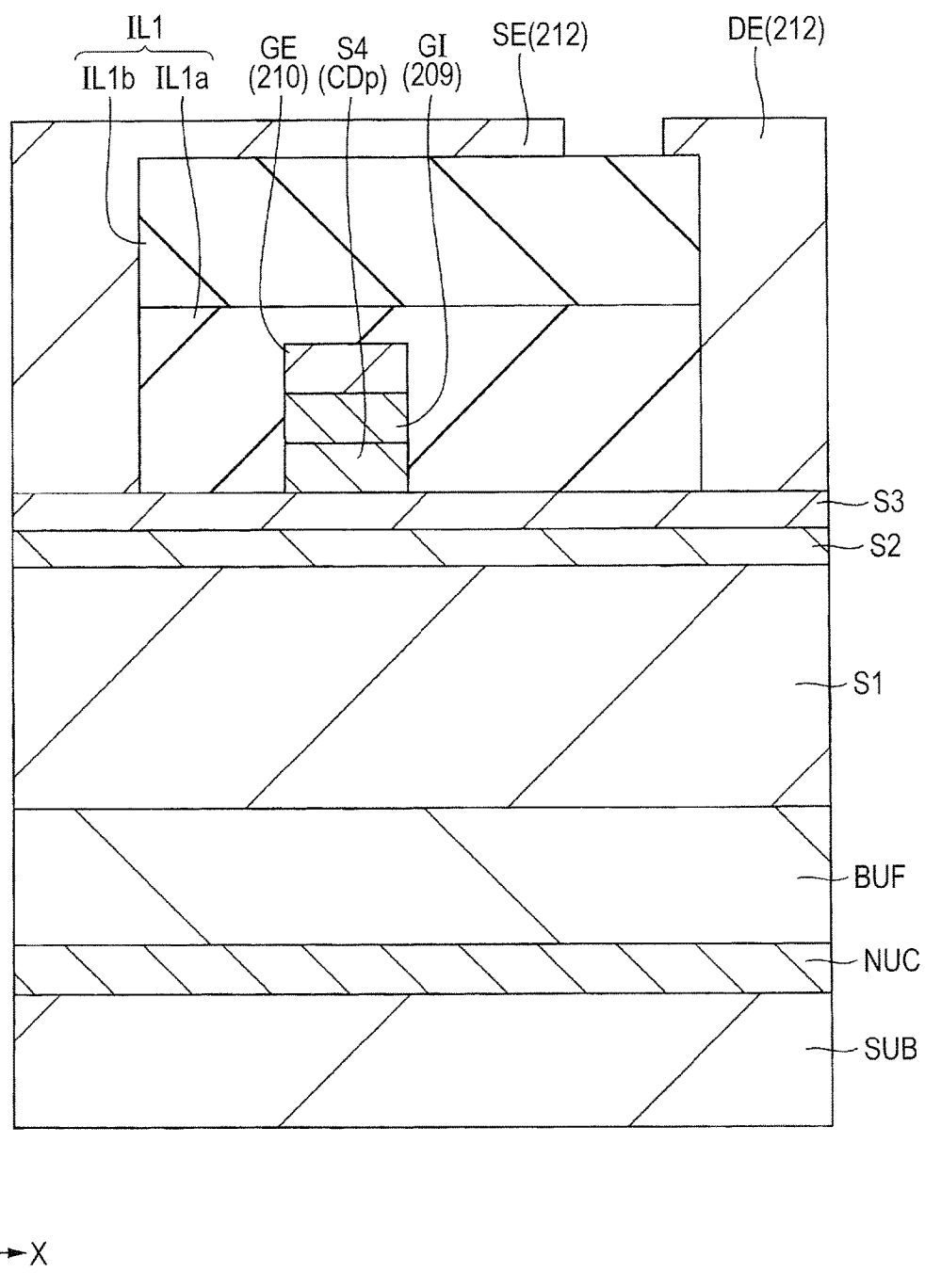
FIG. 26 is a cross-sectional view showing a configuration of a semiconductor device of a fourth embodiment.

FIG. 26 is a cross-sectional view showing a configuration of a semiconductor device of the present embodiment. The present embodiment is the same as the first embodiment except for a laminated portion of the fourth nitride semiconductor layer (mesa portion) S4, the gate insulating film GI, and the gate electrode GE, so that the description other than the description of the laminated portion will be omitted.

As shown in FIG. 26, in the present embodiment, the fourth nitride semiconductor layer (mesa portion) S4 is formed over the third nitride semiconductor layer S3, the gate insulating film GI is formed over the fourth nitride semiconductor layer (mesa portion) S4, and further the gate electrode GE is formed over the gate insulating film GI. The planar shapes of the fourth nitride semiconductor layer (mesa portion) S4, the gate insulating film GI, and the gate electrode GE are substantially the same.

[Description of Manufacturing Method]

Next, the manufacturing method of the semiconductor device of the present embodiment will be described and the configuration of the semiconductor device will be more clarified with reference to FIGS. 27 to 36. FIGS. 27 to 36 are cross-sectional views showing manufacturing steps of the semiconductor device of the present embodiment.

Figure 27:
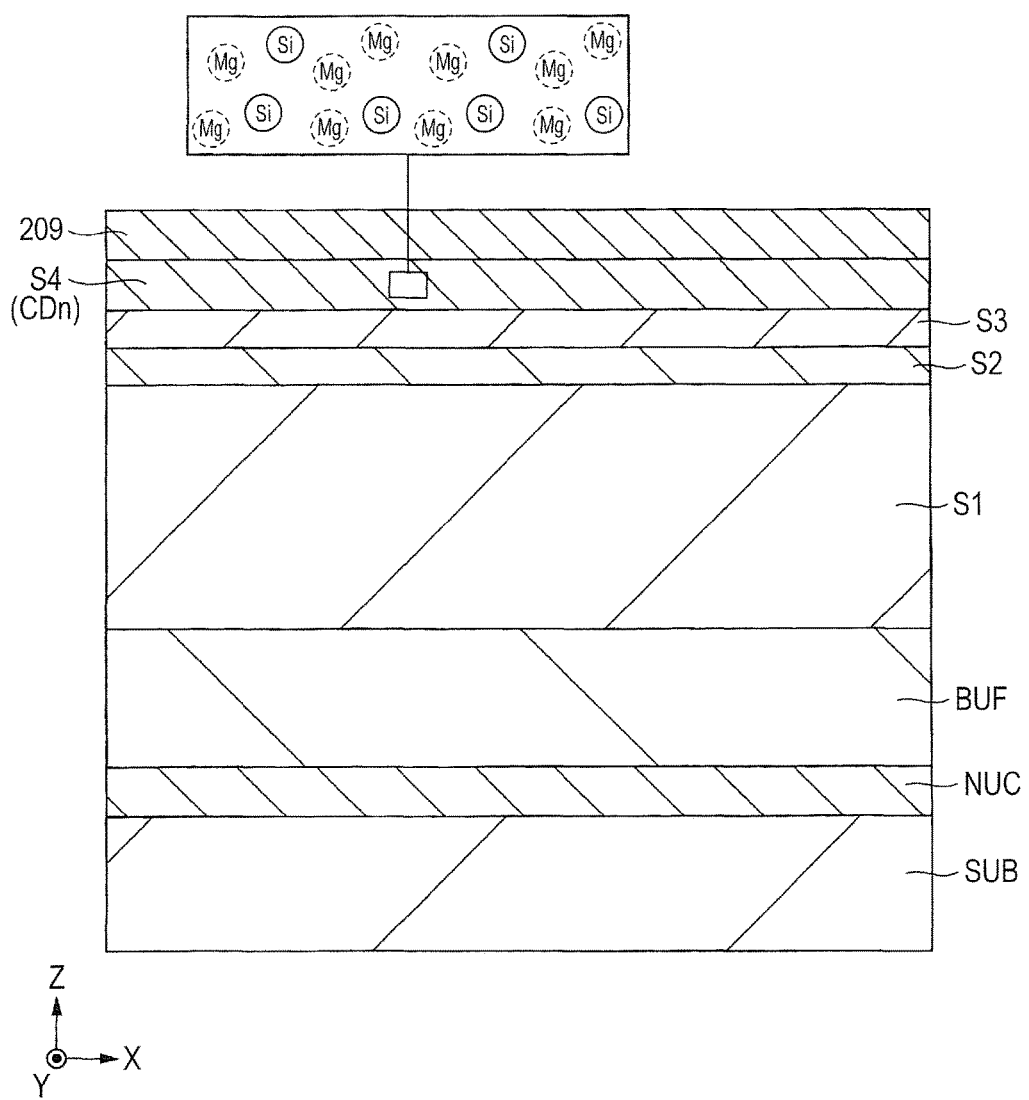
FIG. 27 is a cross-sectional view showing a manufacturing step of the semiconductor device of the fourth embodiment.
Figure 28:
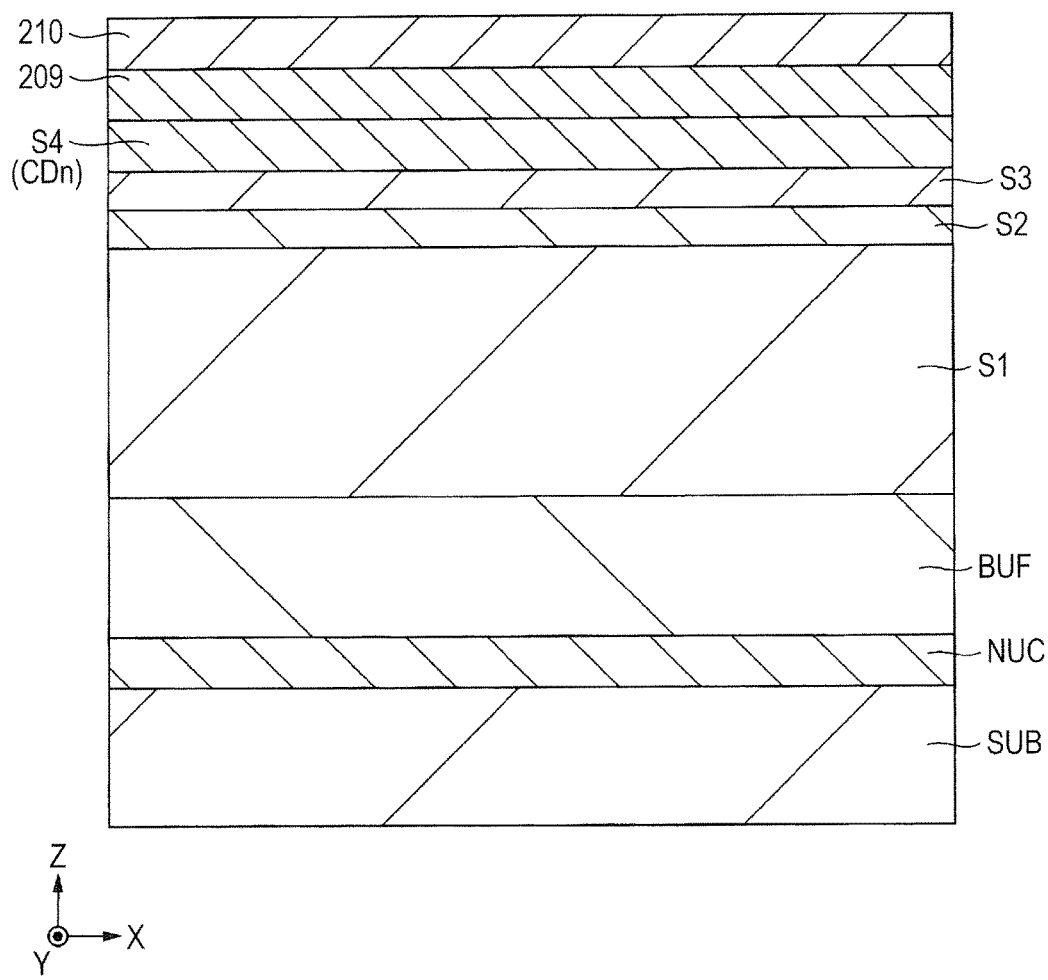
FIG. 28 is a cross-sectional view showing a manufacturing step of the semiconductor device of the fourth embodiment.

For example, until the fourth nitride semiconductor layer S4 shown in FIG. 27, the semiconductor device is manufactured in the same manner as in the first embodiment. Next, a silicon oxide film ($SiO_2$ film) 209 is deposited as an insulating film (as a constituent material of the gate insulating film GI) over the fourth nitride semiconductor layer S4, with a film thickness of about 30 nm by using an ALD method or the like. Next, for example, as a conductive film (as a constituent material of the gate electrode GE), for example, a TiN (titanium nitride) film 210 is deposited over the gate insulating film GI with a film thickness of about 200 nm by using a sputtering method or the like.

Figure 29:
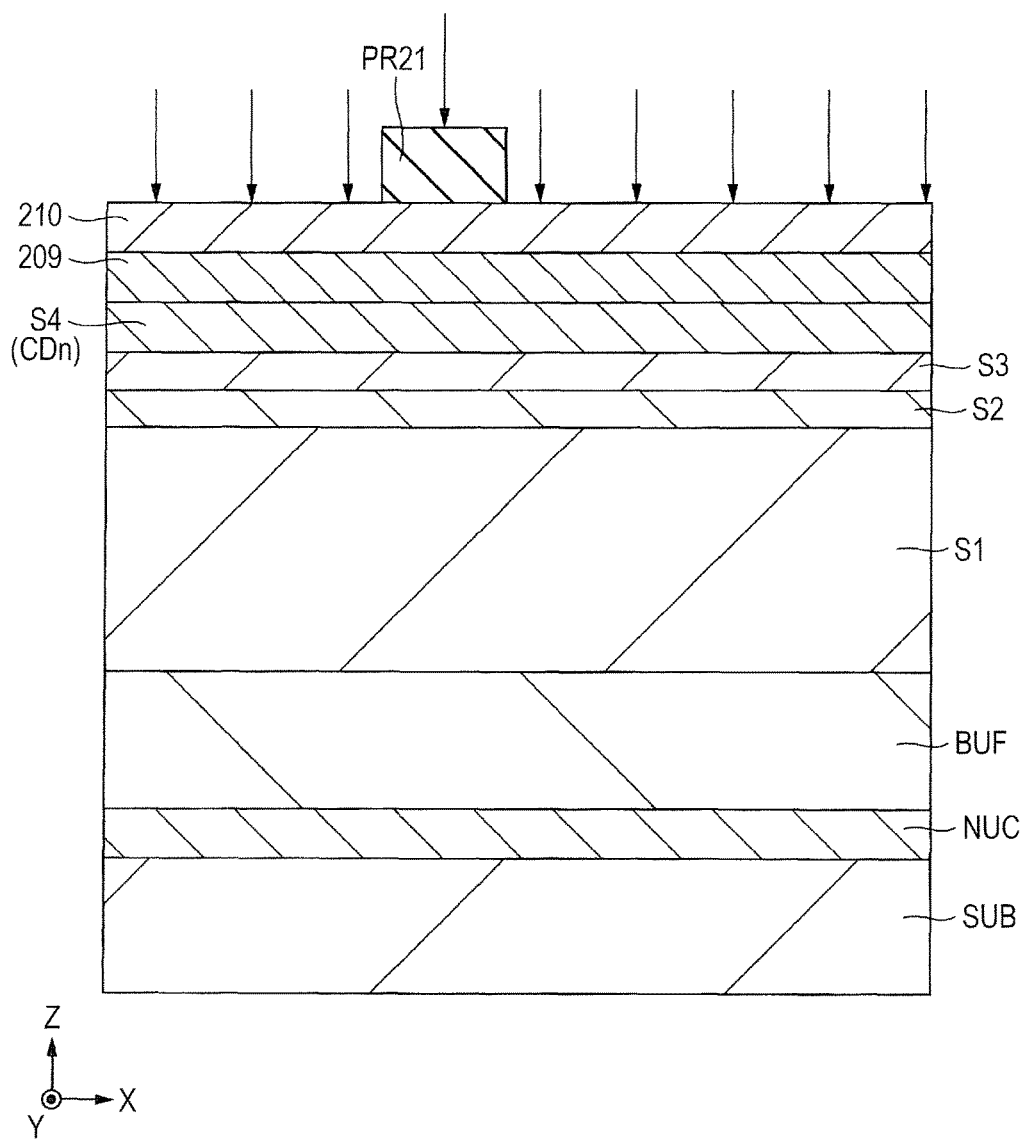
FIG. 29 is a cross-sectional view showing a manufacturing step of the semiconductor device of the fourth embodiment.
Figure 30:
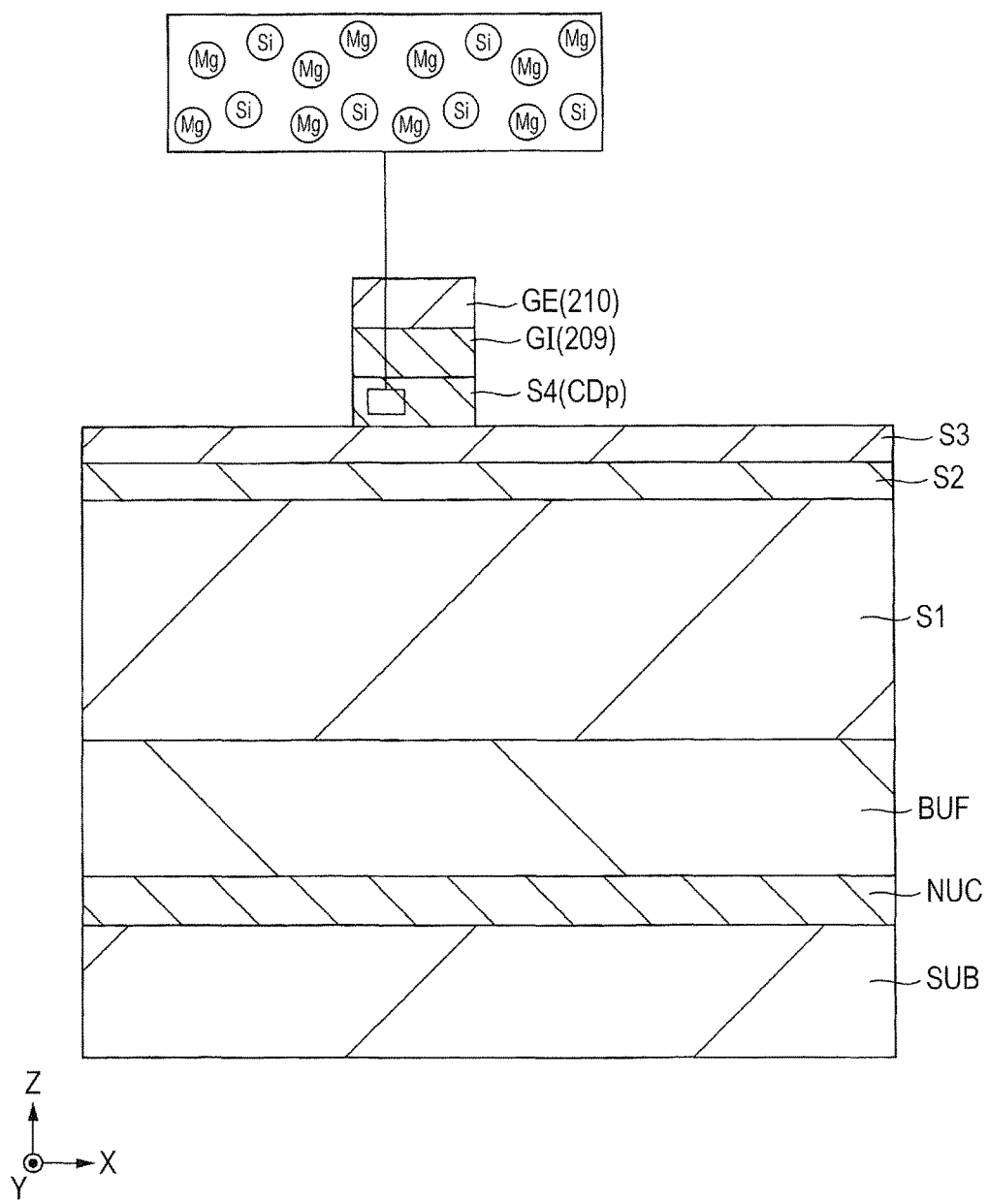
FIG. 30 is a cross-sectional view showing a manufacturing step of the semiconductor device of the fourth embodiment.

Next, as shown in FIG. 29, a photoresist film PR21 is formed in a gate electrode forming region by using a photolithography technique, and the TiN film 210, the silicon oxide film 209, and the fourth nitride semiconductor layer S4 are etched by using the photoresist film PR21 as a mask. Next, the photoresist film PR21 is removed. Thereby, as shown in FIG. 30, it is possible to form a laminated body of the gate electrode GE, the gate insulating film GI, and the fourth nitride semiconductor layer (mesa portion) S4. The layers that form the laminated body correspond to the photoresist film PR21, and the planar shapes of the layers are substantially the same. In other words, the gate electrode GE, the gate insulating film GI, and the fourth nitride semiconductor layer (mesa portion) S4 are substantially completely overlapped with each other in plan view. The planar shape of the laminated body is, for example, a rectangular shape. Next, a heat treatment for activating the p-type impurity (here, Mg) is applied.

Figure 31:
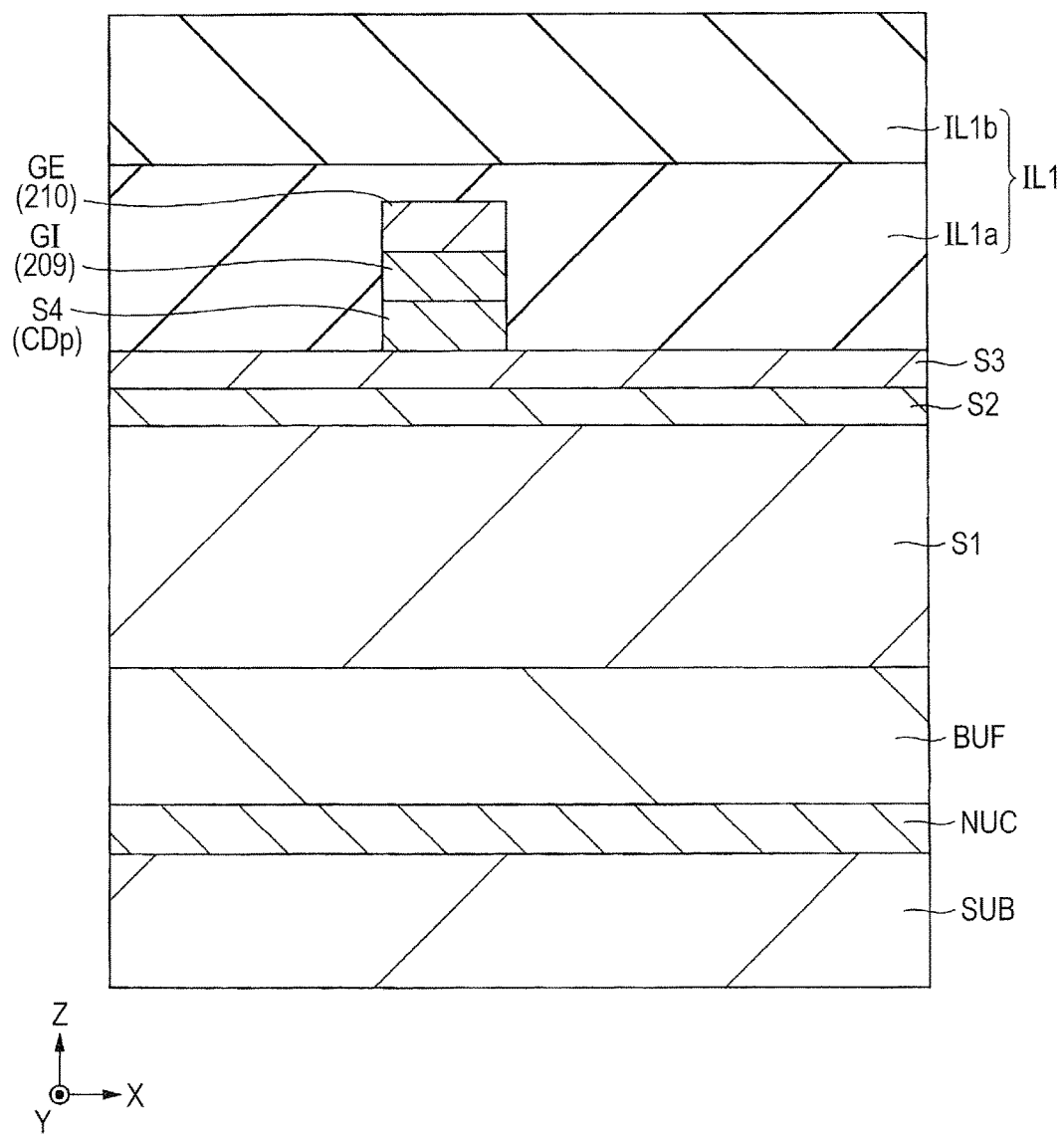
FIG. 31 is a cross-sectional view showing a manufacturing step of the semiconductor device of the fourth embodiment.

Next, in FIG. 31, the interlayer insulating film IL1 is formed over the gate electrode GE and the third nitride semiconductor layer S3. For example, as the interlayer insulating film IL1, a laminated layer of a silicon nitride film IL1a and a silicon nitride film IL1b is deposited by using a CVD method or the like.

Figure 32:
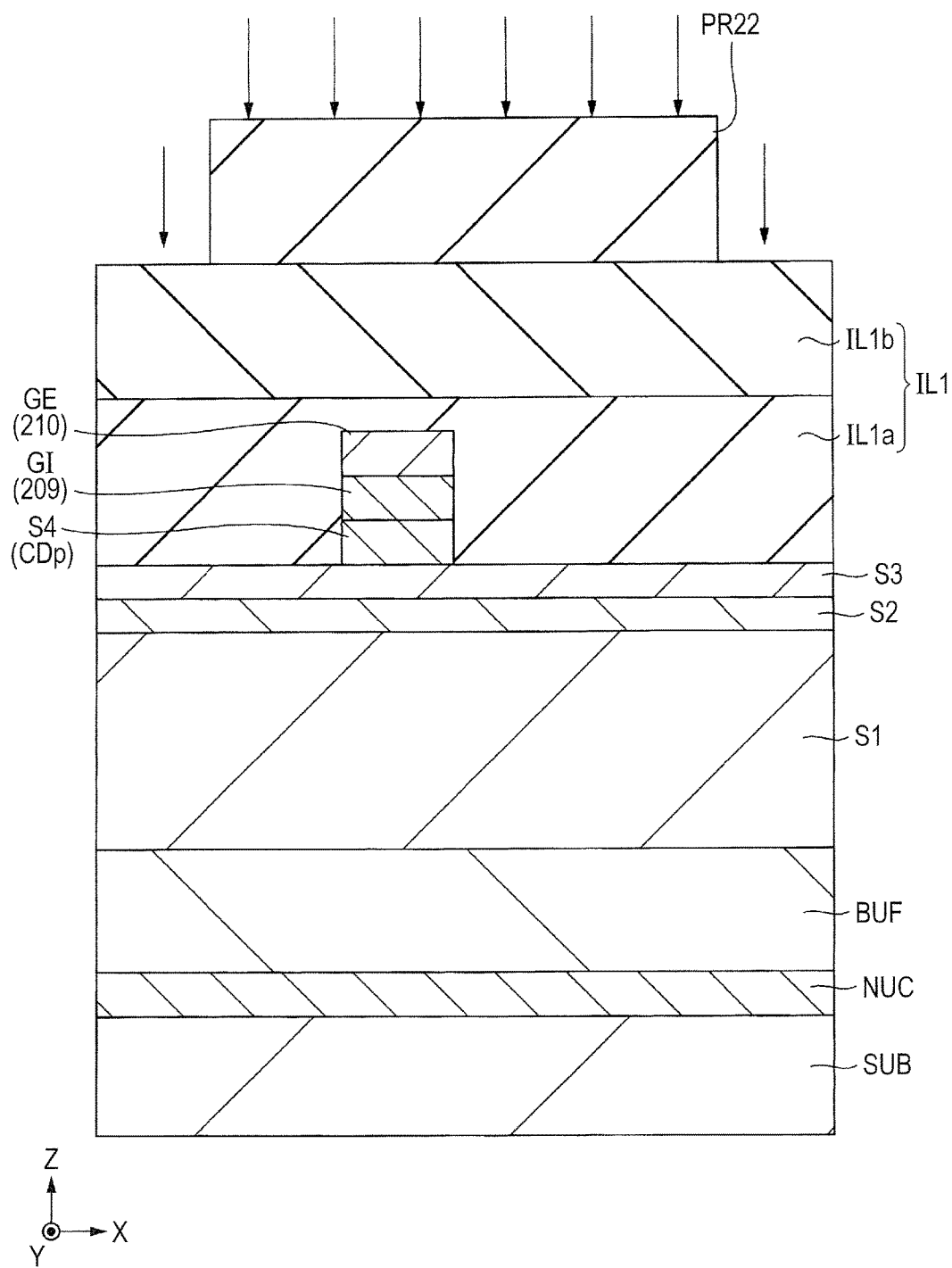
FIG. 32 is a cross-sectional view showing a manufacturing step of the semiconductor device of the fourth embodiment.
Figure 33:
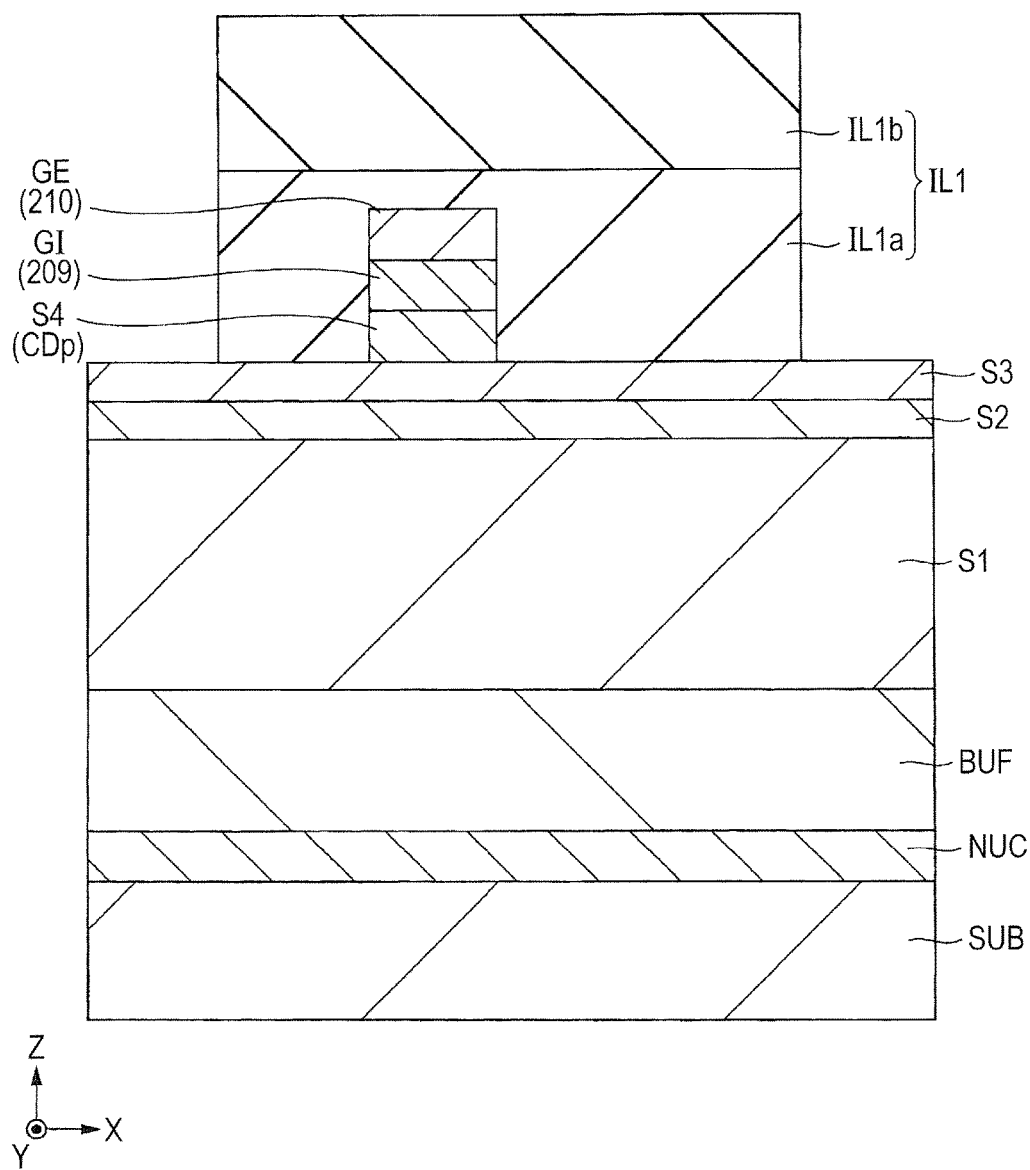
FIG. 33 is a cross-sectional view showing a manufacturing step of the semiconductor device of the fourth embodiment.

Next, contact holes are formed in the interlayer insulating film IL1 by using photolithography and etching techniques. For example, as shown in FIG. 32, a photoresist film PR22, which has an opening portion in each of a source electrode coupling region and a drain electrode coupling region, is formed over the interlayer insulating film IL1. Next, the contact holes are formed by etching the interlayer insulating film IL1 by using the photoresist film PR22 as a mask (FIG. 33). Thereafter, the photoresist film PR22 is removed.

Figure 34:
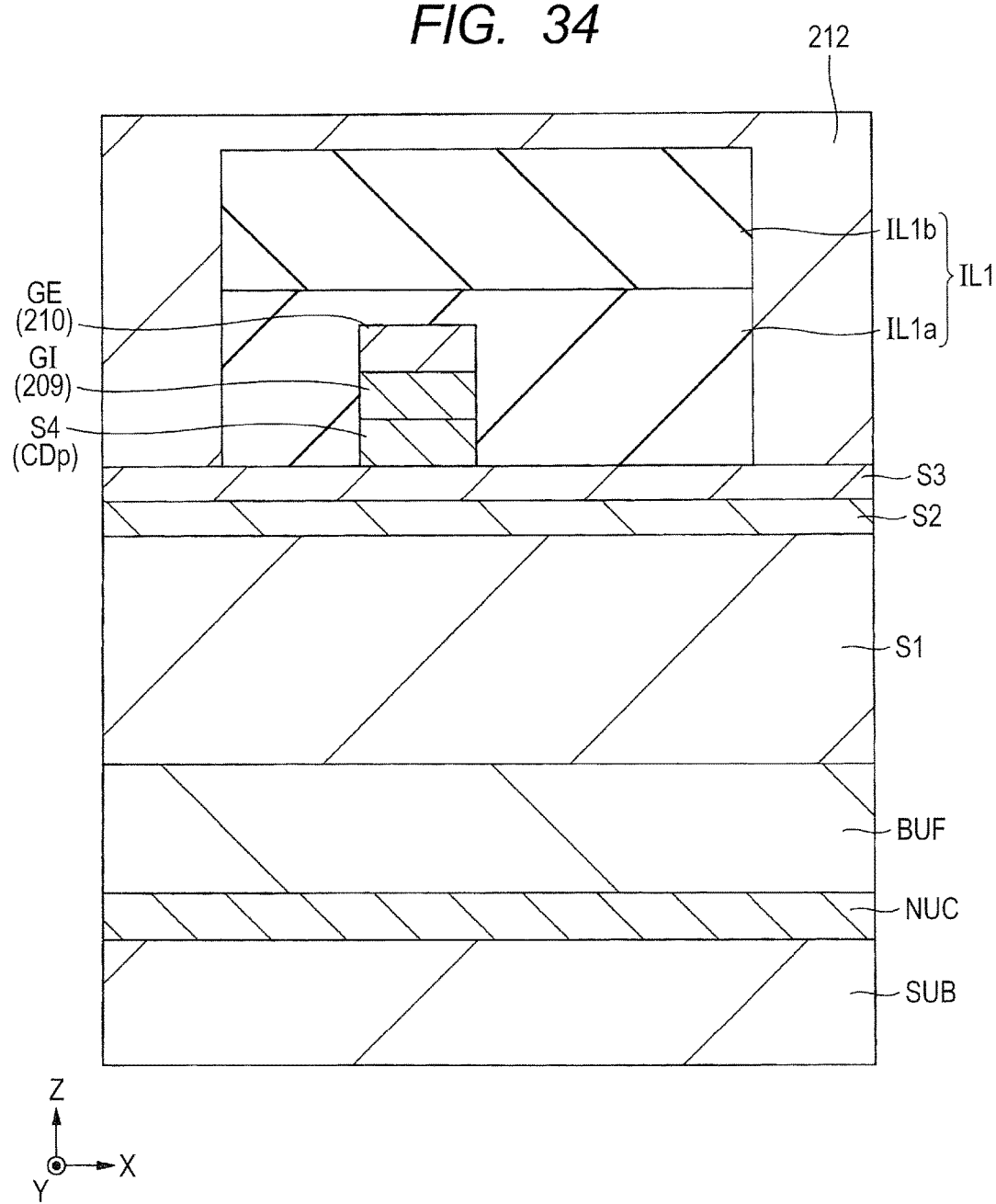
FIG. 34 is a cross-sectional view showing a manufacturing step of the semiconductor device of the fourth embodiment.
Figure 35:
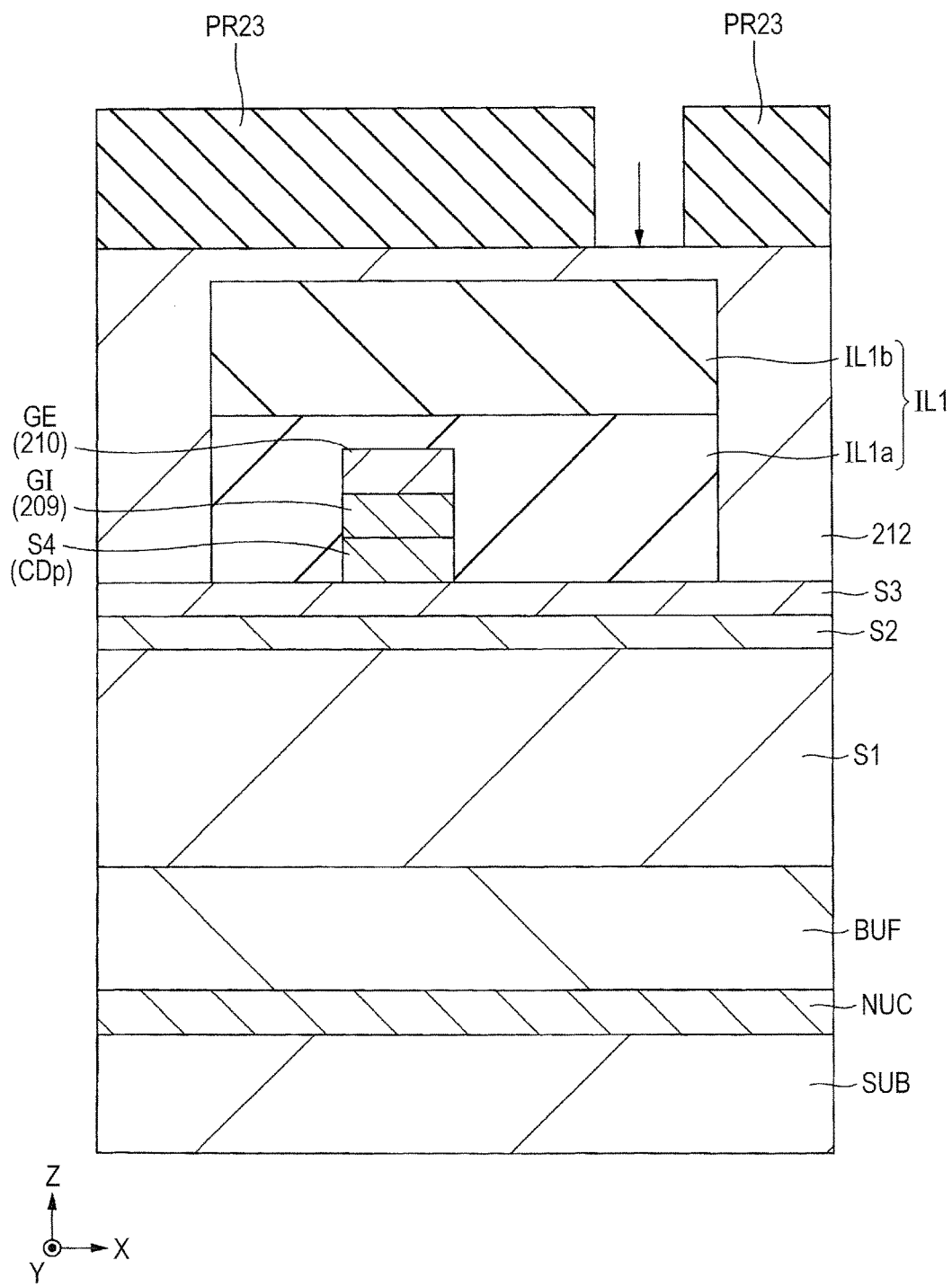
FIG. 35 is a cross-sectional view showing a manufacturing step of the semiconductor device of the fourth embodiment.

Next, as shown in FIGS. 34 and 35, the source electrode SE and the drain electrode DE are formed in the contact holes and over the interlayer insulating film IL1. For example, as shown in FIG. 34, a conductive film 212 is formed over the interlayer insulating film IL1 including the inside of the contact holes. Thereafter, a heat treatment is applied. For example, a heat treatment for 30 minutes at 500° C. is performed. Thereby, an ohmic contact can be formed between the conductive film (Al/Ti film) 212 and a layer under the conductive film 212.

Figure 36:
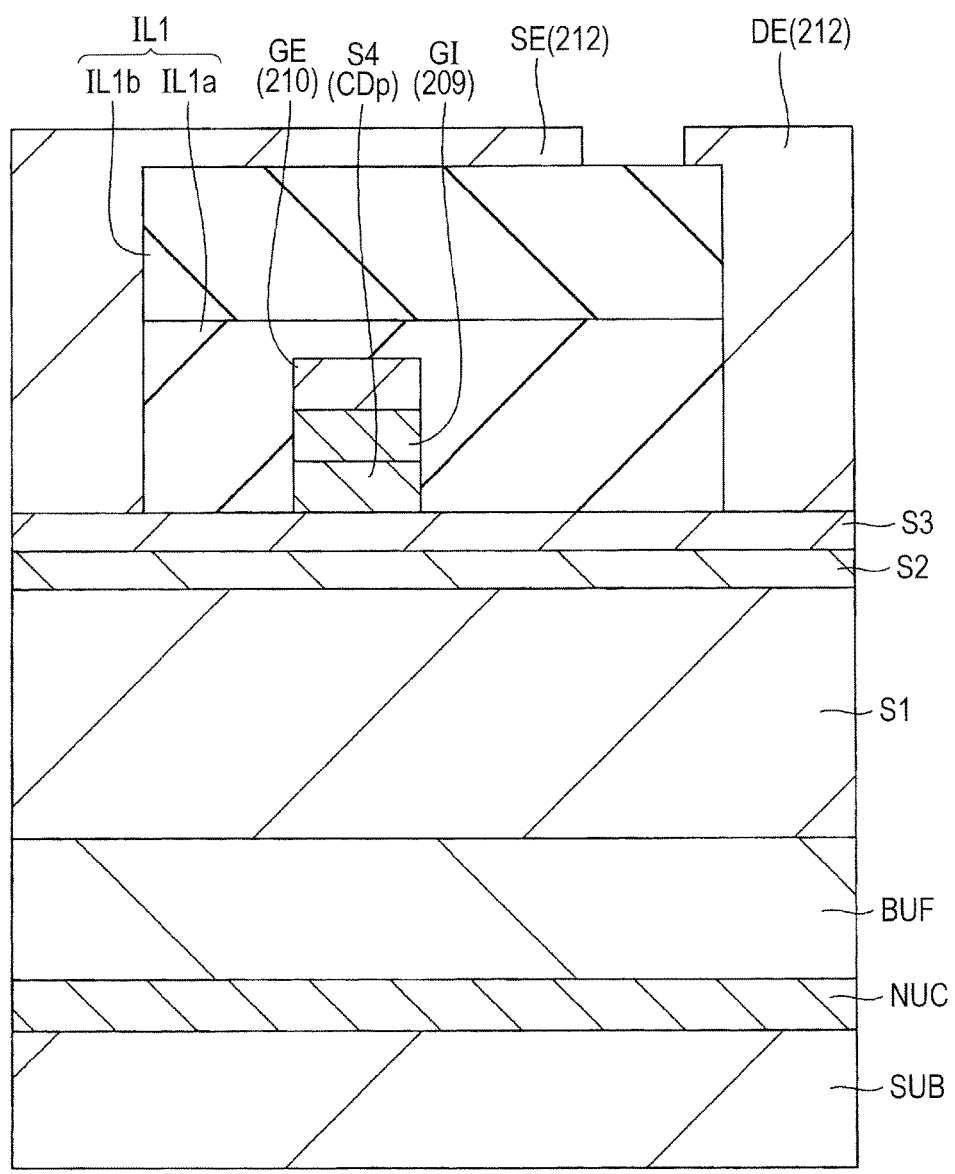
FIG. 36 is a cross-sectional view showing a manufacturing step of the semiconductor device of the fourth embodiment.

Next, as shown in FIG. 35, a photoresist film PR23 is formed in a source electrode coupling region and a drain electrode coupling region, and the source electrode SE and the drain electrode DE are formed by etching the conductive film (Al/Ti film) by using the photoresist film PR23 as a mask (FIG. 36). Next, the photoresist film PR23 is removed.

Thereafter, an insulating film may be formed over the interlayer insulating film IL1 including a portion over the source electrode SE and the drain electrode DE, and further, an upper layer wiring may be formed. Over an uppermost layer wiring, a protection film formed of an insulating film may be formed.

By the steps described above, it is possible to form the semiconductor device of the present embodiment. The steps described above are an example, and the semiconductor device of the present embodiment may be manufactured by steps other than the steps described above.

As described above, according to the semiconductor device of the present embodiment, it is possible to most reduce the steps for exposing the fourth nitride semiconductor layer S4. Specifically, the fourth nitride semiconductor layer S4 is not exposed after the step of forming the constituent material (209) of the gate insulating film GI. Thereby, it is possible to suppress contamination and crystal disturbance of the interface between the fourth nitride semiconductor layer S4 and the gate insulating film GI, so that the characteristics of the semiconductor device can be stabilized.

Further, also in the present embodiment, the mesa-type fourth nitride semiconductor layer (mesa portion) is the co-doped layer. Thereby, as described in the first embodiment, it is possible to improve the threshold potential and to improve the normally-off characteristics. Further, the fourth nitride semiconductor layer S4 is n-type until the gate insulating film is formed over the fourth nitride semiconductor layer S4, and the fourth nitride semiconductor layer S4 is made neutral or p-type after the gate insulating film is formed. Thereby, it is possible to improve the threshold potential and improve the normally-off characteristics.

Fifth Embodiment

In the first to the fourth embodiments described above, the side surfaces of the mesa-type fourth nitride semiconductor layer (mesa portion) S4 may have a tapered shape (forward tapered shape). A taper angle (an inclined angle, $\theta$) of the side surface of the mesa-type fourth nitride semiconductor layer (mesa portion) S4 is an angle of the inside of the side surface of the mesa portion and is an angle between the surface of the third nitride semiconductor layer S3 and the side surface of the fourth nitride semiconductor layer S4. The taper angle (θ) of the side surface of the mesa portion is, for example, smaller than 90° and greater than or equal to 45° (FIGS. 37 to 40).

First Application Example

Figure 37:
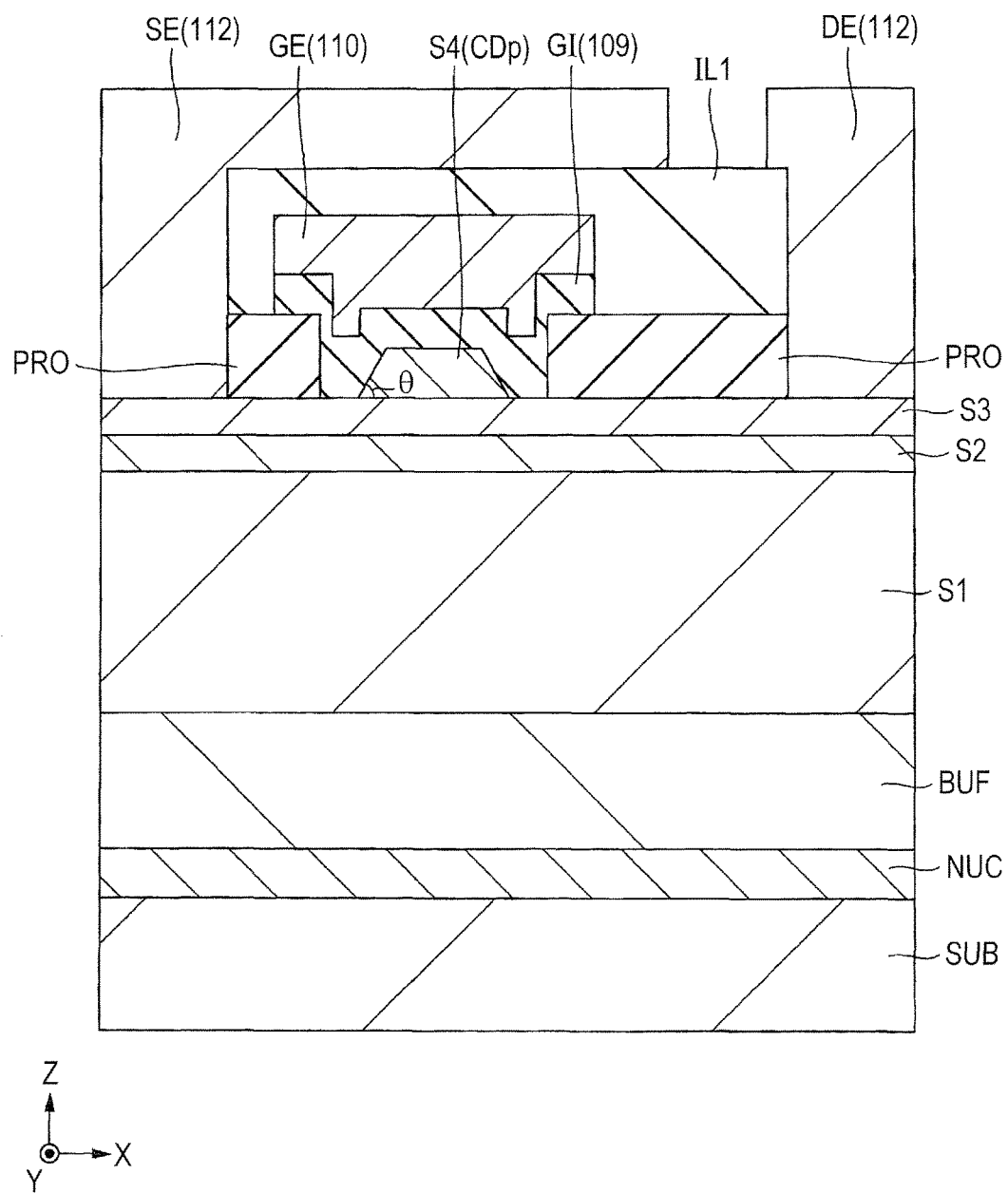
FIG. 37 is a cross-sectional view showing a configuration of a semiconductor device of a first application example of a fifth embodiment.

FIG. 37 is a cross-sectional view showing a configuration of a semiconductor device of a first application example of the present embodiment. The present application example corresponds to a configuration in which the fourth nitride semiconductor layer (mesa portion) S4 of the first embodiment is formed into a tapered shape.

For example, it is possible to form the side surfaces of the fourth nitride semiconductor layer S4 into a tapered shape by applying heat treatment after etching the fourth nitride semiconductor layer S4. For example, as a heat treatment, in a nitrogen atmosphere, a heat treatment for abut 10 minutes at 600° C. is performed. Further, the side surfaces of the fourth nitride semiconductor layer S4 may be formed into a tapered shape by performing wet etching.

Second Application Example

Figure 38:
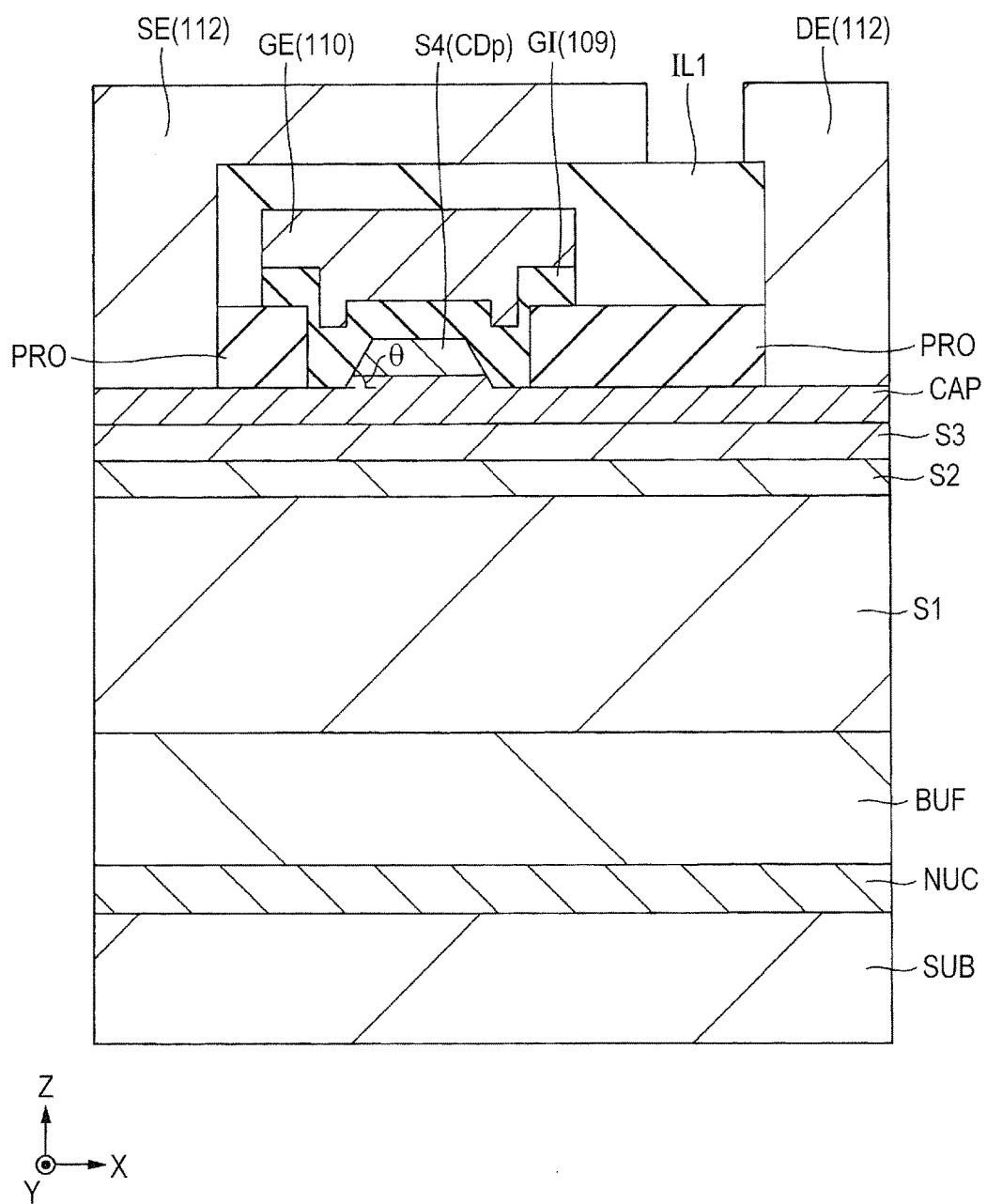
FIG. 38 is a cross-sectional view showing a configuration of a semiconductor device of a second application example of the fifth embodiment.

FIG. 38 is a cross-sectional view showing a configuration of a semiconductor device of a second application example of the present embodiment. The present application example corresponds to a configuration in which the fourth nitride semiconductor layer (mesa portion) S4 of the second embodiment is formed into a tapered shape. Also in the present application example, in the same manner as in the first application example, it is possible to form the side surfaces of the fourth nitride semiconductor layer S4 into a tapered shape by performing heat treatment or wet etching.

Third Application Example

Figure 39:
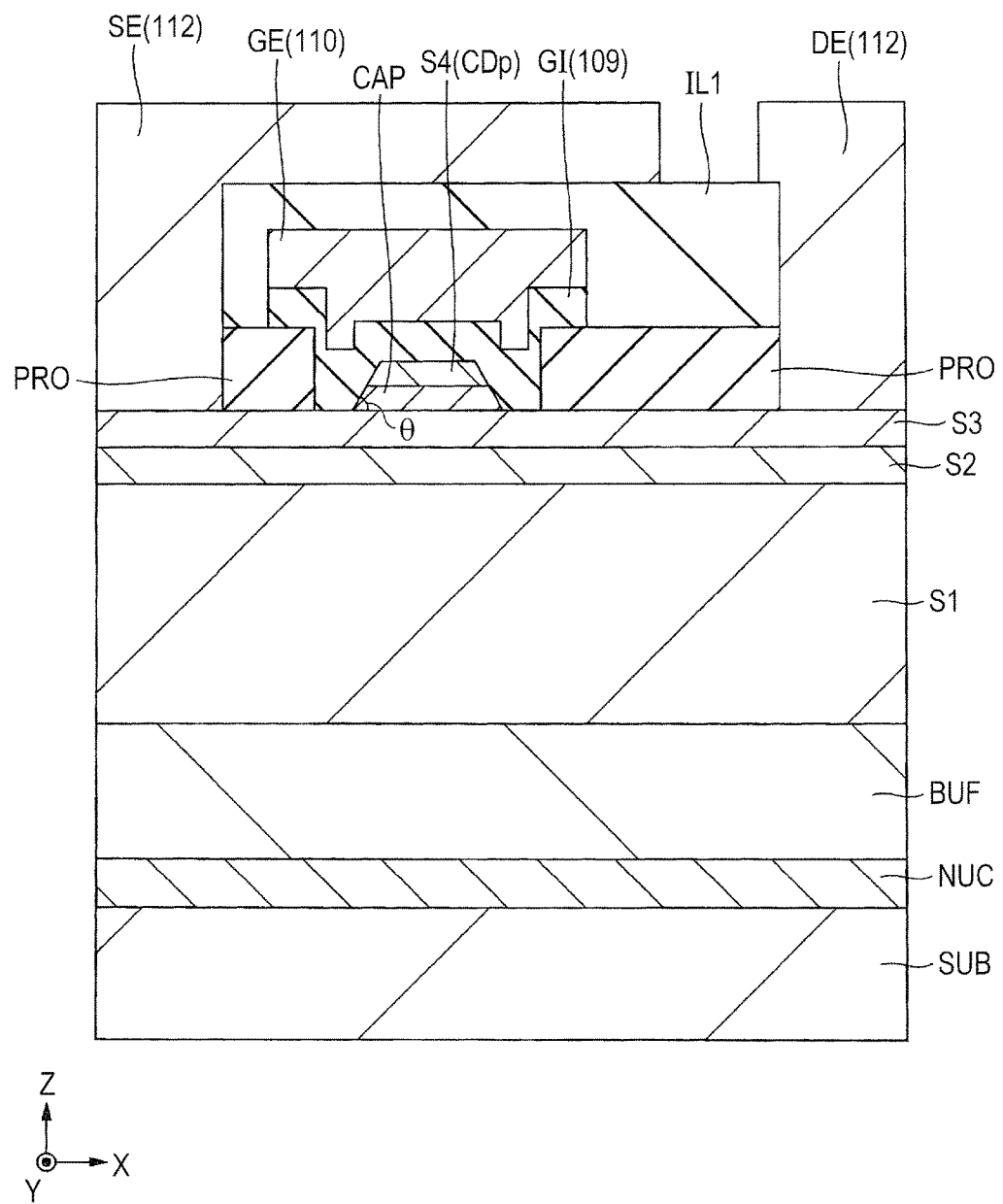
FIG. 39 is a cross-sectional view showing a configuration of a semiconductor device of a third application example of the fifth embodiment.

FIG. 39 is a cross-sectional view showing a configuration of a semiconductor device of a third application example of the present embodiment. The present application example corresponds to a configuration in which side surfaces of a mesa portion formed of a laminated body of the fifth nitride semiconductor layer CAP and the fourth nitride semiconductor layer S4 are formed into a tapered shape.

For example, it is possible to form the side surfaces of the laminated body into a tapered shape by applying heat treatment or performing wet etching after etching the laminated body of the fifth nitride semiconductor layer CAP and the fourth nitride semiconductor layer S4.

Fourth Application Example

Figure 40:
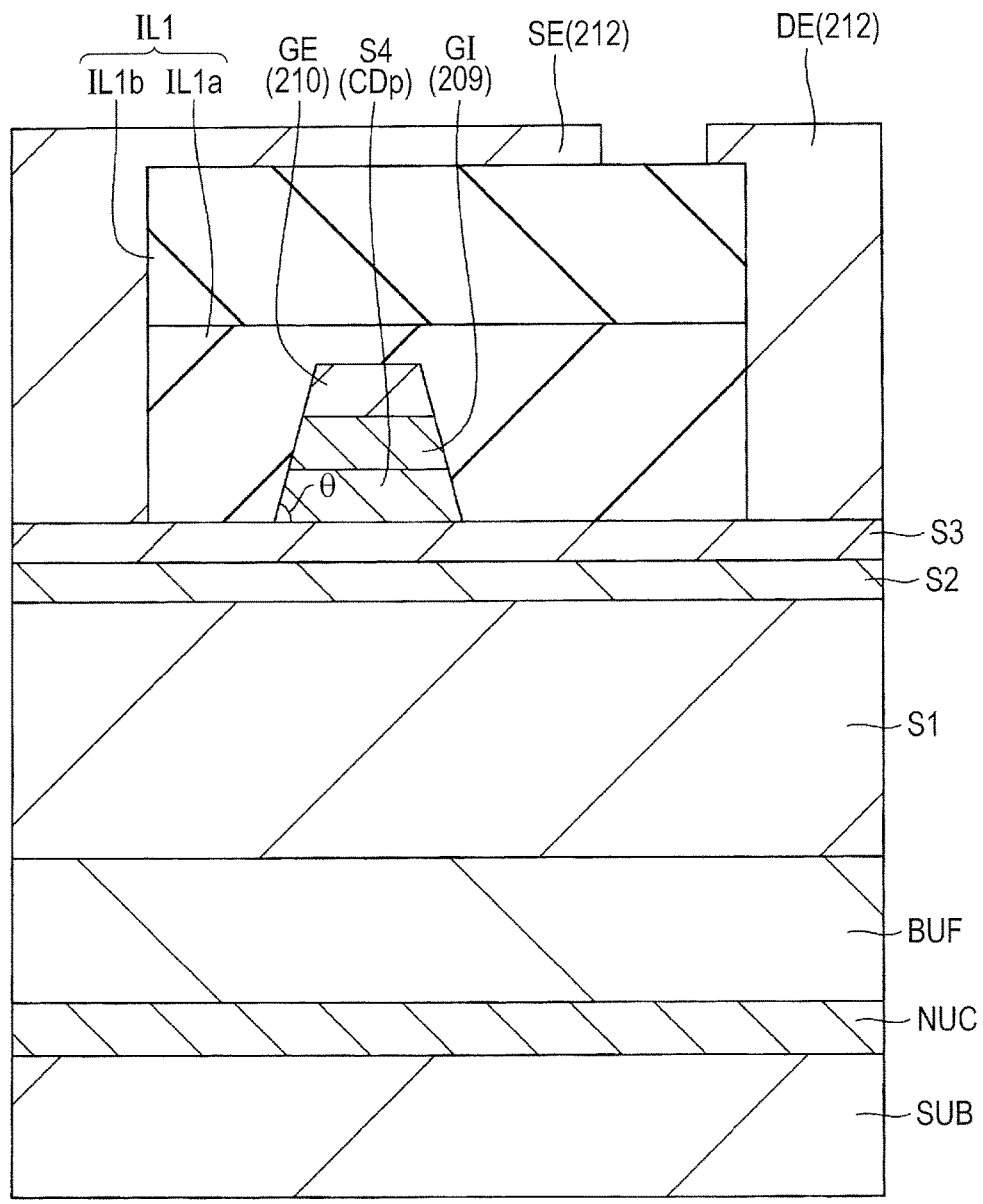
FIG. 40 is a cross-sectional view showing a configuration of a semiconductor device of a fourth application example of the fifth embodiment.

FIG. 40 is a cross-sectional view showing a configuration of a semiconductor device of a fourth application example of the present embodiment. The present application example corresponds to a configuration in which side surfaces of a laminated body of the gate electrode GE, the gate insulating film GI, and the fourth nitride semiconductor layer (mesa portion) S4 are formed into a tapered shape.

For example, it is possible to form the side surfaces of the laminated body into a tapered shape by applying heat treatment or performing wet etching after etching the conductive film (210), the insulating film (209), and the fourth nitride semiconductor layer S4.

Fifth Application Example

In the first embodiment and the like, the source electrode SE and the drain electrode DE are formed by patterning a conductive film that is formed inside the contact hole and over the interlayer insulating film IL1. However, the source electrode SE and the drain electrode DE may be formed by a so-called liftoff method.

Figure 41:
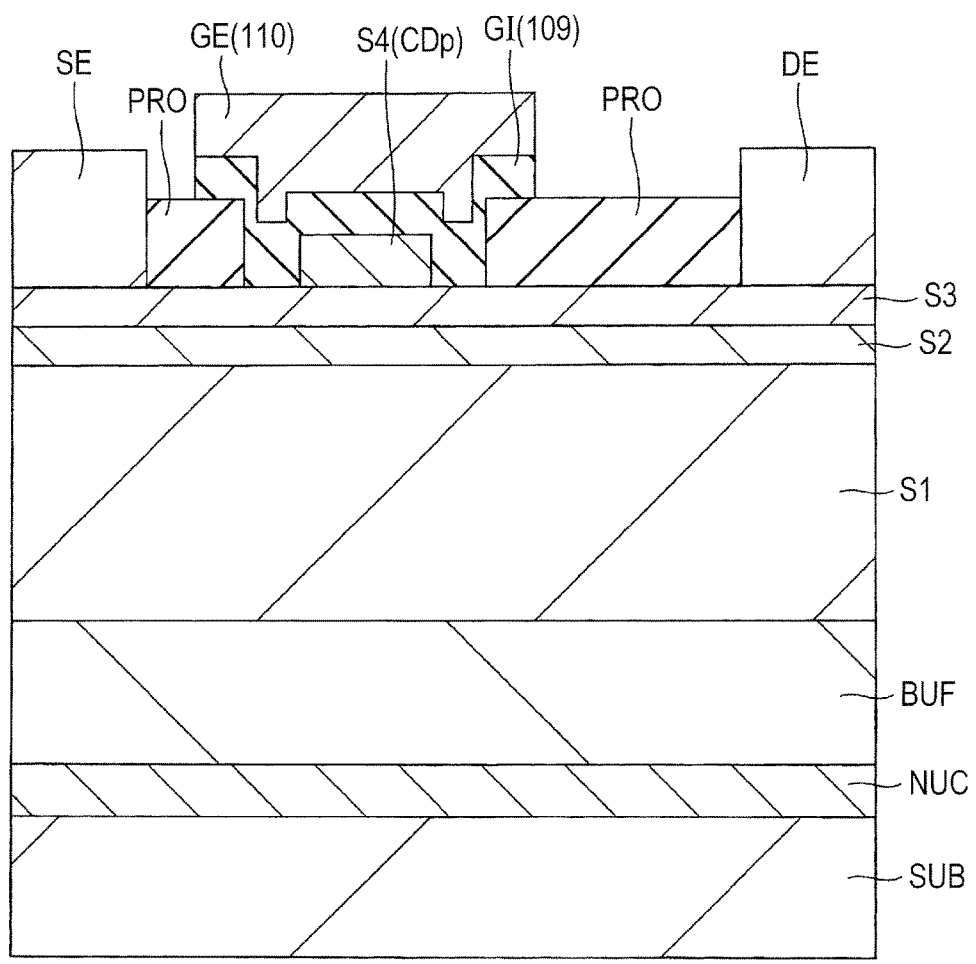
FIG. 41 is a cross-sectional view showing a configuration of a semiconductor device of a fifth application example of the fifth embodiment.

FIG. 41 is a cross-sectional view showing a configuration of a semiconductor device of a fifth application example of the present embodiment. For example, as described with reference to FIG. 17, the gate electrode GE is formed over the mesa-type fourth nitride semiconductor layer (mesa portion) S4 through the gate insulating film GI, and thereafter the surface protection film PRO in the source electrode coupling region and the drain electrode coupling region is removed by etching the surface protection film PRO on both sides of the gate electrode GE. Next, a photoresist film (not shown in FIG. 41) that covers a region other than the source electrode coupling region and the drain electrode coupling region is formed, and a conductive film is deposited over the source electrode coupling region, the drain electrode coupling region, and the photoresist film (not shown in FIG. 41). Next, the source electrode SE and the drain electrode DE are formed by removing the conductive film in a region other than the source electrode coupling region and the drain electrode coupling region along with the photoresist film (FIG. 41).

While the invention made by the inventors has been specifically described based on the embodiments, it is needless to say that the present invention is not limited to the embodiments and may be variously modified without departing from the scope of the invention.

For example, components of the embodiments and application examples described above may be appropriately combined such as providing the fifth nitride semiconductor layer CAP of the second and the third embodiments over the third nitride semiconductor layer S3 of the fourth embodiment.

What is claimed is:
1. A semiconductor device comprising:
   a first nitride semiconductor layer;
   a second nitride semiconductor layer that is formed over the first nitride semiconductor layer;
   a third nitride semiconductor layer that is formed over the second nitride semiconductor layer;
   a mesa-type fourth nitride semiconductor layer that is formed over the third nitride semiconductor layer;
   a source electrode that is formed over the third nitride semiconductor layer and on one side of the fourth nitride semiconductor layer;
   a drain electrode that is formed over the third nitride semiconductor layer and on the other side of the fourth nitride semiconductor layer;
   a gate insulating film that covers the fourth nitride semiconductor layer; and
   a gate electrode that is formed over the gate insulating film,
   wherein an electron affinity of the second nitride semiconductor layer is greater than an electron affinity of the first nitride semiconductor layer and is greater than an electron affinity of the third nitride semiconductor layer, wherein an electron affinity of the fourth nitride semiconductor layer is greater than or equal to the electron affinity of the first nitride semiconductor layer, and wherein the fourth nitride semiconductor layer has p-type impurity and n-type impurity and concentration of the p-type impurity is greater than concentration of the n-type impurity.

2. The semiconductor device according to claim 1, wherein the concentration of the p-type impurity in the fourth nitride semiconductor layer is five times or more the concentration of the n-type impurity.

3. The semiconductor device according to claim 1, wherein the concentration of the p-type impurity in the fourth nitride semiconductor layer is ten times or more the concentration of the n-type impurity.

4. The semiconductor device according to claim 1, wherein a product of the concentration of the p-type impurity in the fourth nitride semiconductor layer and a film thickness of the fourth nitride semiconductor layer is greater than or equal to $1\times10^{12}$ cm$^{-2}$.

5. The semiconductor device according to claim 1, wherein the fourth nitride semiconductor layer contains hydrogen; and wherein the concentration of the p-type impurity is greater than a sum of the concentration of the n-type impurity and concentration of the hydrogen.

6. The semiconductor device according to claim 1, further comprising:

a fifth nitride semiconductor layer that is formed over the third nitride semiconductor layer, wherein the fourth nitride semiconductor layer is formed over the fifth nitride semiconductor layer.

7. The semiconductor device according to claim 6, wherein the fifth nitride semiconductor layer is mesa type, and wherein a laminated body of the fifth nitride semiconductor layer and the fourth nitride semiconductor layer is formed over the third nitride semiconductor layer.

8. The semiconductor device according to claim 1, wherein planar shapes of the fourth nitride semiconductor layer, the gate insulating film, and the gate electrode are substantially the same.

9. The semiconductor device according to claim 1, wherein aside surface of the mesa-type fourth nitride semiconductor layer has a tapered shape.

* * * * *